(12) United States Patent
Nakamura

(10) Patent No.: US 6,483,360 B2
(45) Date of Patent: Nov. 19, 2002

(54) DIGITAL PHASE CONTROL USING FIRST AND SECOND DELAY LINES

(75) Inventor: Satoshi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/921,866

(22) Filed: Aug. 3, 2001

(65) Prior Publication Data

US 2002/0036526 A1 Mar. 28, 2002

(30) Foreign Application Priority Data

Aug. 4, 2000 (JP) .................................... 2000-237458

(51) Int. Cl.$^7$ ................................................ H03L 7/06
(52) U.S. Cl. ...................................... 327/158; 327/271
(58) Field of Search ................................ 327/276, 277, 327/284, 269, 270, 271, 149, 152–153, 158, 16

(56) References Cited

U.S. PATENT DOCUMENTS 5,801,559 A  * 9/1998 Sawai et al. ................ 327/116
6,297,680 B1 * 10/2001 Kondo ......................... 327/276

FOREIGN PATENT DOCUMENTS

WO      WO 95/22206         8/1995

* cited by examiner

Primary Examiner—Kenneth Wells
Assistant Examiner—Cassandra Cox
(74) Attorney, Agent, or Firm—Scully, Scott, Murphy & Presser

(57) ABSTRACT

A digital phase control method phase shifts a predetermined number of clock signals having the same frequency and having different phases at high precision and at high resolution as a whole with its phase interval maintained to keep a predetermined interval. The digital phase control method comprises the steps of preparing fourteen first multi-phase clock signals having a fixed phase, of preparing sixteen second multi-phase clock signals, of phase locking a specific clock signal of the fourteen first multi-phase clock signals with a particular clock signal of the sixteen second multi-phase clock signals, and of changing a combination of the specific and the particular clock signals to be phase-locked to phase shift the second multi-phase clock signals. In addition, in order to generate the second multi-phase clock signals, a delay line comprising ring-shaped chained delay buffers may be used.

12 Claims, 13 Drawing Sheets

|        |                  | c1   | c2   | c3   | d4   |
|--------|------------------|------|------|------|------|
| ⟨11⟩   | ①→a(c1):         | 0°   | 90°  | 180° | 270° |
| ⟨12⟩   | ②→a(c1):         | 120° | 210° | 300° | 30°  |
| ⟨13⟩   | ③→a(c1):         | 240° | 330° | 60°  | 150° |
| ⟨21⟩   | ①→b(c2):         | 270° | 0°   | 90°  | 180° |
| ⟨22⟩   | ②→b(c2):         | 30°  | 120° | 210° | 300° |
| ⟨23⟩   | ③→b(c2):         | 150° | 240° | 330° | 60°  |
| ⟨31⟩   | ①→c(c3):         | 180° | 270° | 0°   | 90°  |
| ⟨32⟩   | ②→c(c3):         | 300° | 30°  | 120° | 210° |
| ⟨33⟩   | ③→c(c3):         | 60°  | 150° | 240° | 330° |
| ⟨41⟩   | ①→d(c4):         | 90°  | 180° | 270° | 0°   |
| ⟨42⟩   | ②→d(c4):         | 210° | 300° | 30°  | 120° |
| ⟨43⟩   | ③→d(c4):         | 330° | 60°  | 150° | 240° |

⟨11⟩ → ⟨22⟩ → ⟨33⟩ → ⟨41⟩
→ ⟨12⟩ → ⟨23⟩ → ⟨31⟩ → ⟨42⟩
→ ⟨13⟩ → ⟨21⟩ → ⟨32⟩ → ⟨43⟩

RESOLUTION: 360°/12=30°

```
              c1    c2    c3    d4
⟨11⟩ ①→a(c1):   0°   90°  180°  270°
⟨12⟩ ②→a(c1): 120°  210°  300°   30°
⟨13⟩ ③→a(c1): 240°  330°   60°  150°

⟨21⟩ ①→b(c2): 270°    0°   90°  180°
⟨22⟩ ②→b(c2):  30°  120°  210°  300°
⟨23⟩ ③→b(c2): 150°  240°  330°   60°

⟨31⟩ ①→c(c3): 180°  270°    0°   90°
⟨32⟩ ②→c(c3): 300°   30°  120°  210°
⟨33⟩ ③→c(c3):  60°  150°  240°  330°

⟨41⟩ ①→d(c4):  90°  180°  270°    0°
⟨42⟩ ②→d(c4): 210°  300°   30°  120°
⟨43⟩ ③→d(c4): 330°   60°  150°  240°
```

⟨11⟩ → ⟨22⟩ → ⟨33⟩ → ⟨41⟩
→ ⟨12⟩ → ⟨23⟩ → ⟨31⟩ → ⟨42⟩
→ ⟨13⟩ → ⟨21⟩ → ⟨32⟩ → ⟨43⟩

RESOLUTION: 360°/12 = 30°

DIGITAL PHASE CONTROL USING FIRST AND SECOND DELAY LINES

BACKGROUND OF THE INVENTION

This invention relates to a digital phase control method and a digital phase control circuit and, more particularly, to technique for phase shifting a predetermined number of clock signals having the same frequency and having different phases with high precision and high resolution as a whole with those phase intervals maintained to keep a predetermined interval.

Actually, in fields of multi-communications and recording/reproducing of information, a request has been made as regards techniques for phase shifting a predetermined number of clock signals (multi-phase clock signals) having the same frequency and having different phases with high precision and at high resolution as a whole with those phase intervals maintained to keep a predetermined interval.

In digital transmission of data, bit synchronization using the multi-phase clock signals is carried out on extracting and reproducing a received data signal. In this event, there is not only a method of controlling a selection circuit for selecting one clock signal from the multi-phase clock signals but also a method of synchronizing the multi-phase clock signals to a data signal by phase controlling (phase shifting) all of the multi-phase clock signals.

As one of conventional phase control methods, a phase interpolation method is known in the art. The phase interpolation method is a method of synthesizing given two clock signals having different phases to produce a synthesized clock signal having a phase between the different phases of the two clock signals.

In the manner which will later be described in conjunction with FIGS. 2 and 3, a conventional phase interpolator generally comprises a core portion and a filter portion. According to the phase interpolate method, it is possible to carry out digital phase control at high resolution.

However, problems arise in the digital phase control according to the above-mentioned phase interpolation method as follows.

It is necessary for the above-mentioned phase interpolation method to use clock signals having four phases of 0°, 90°, 180°, and 270°. In a case of applying the phase interpolation method to the phase control for the multi-phase clock signals, increase in consumed power and circuit's scale are problems.

In addition, the above-mentioned phase interpolation method is suitable to phase control a clock signal having one phase with high precision because the phase interpolation method is for phase controlling the clock signal having one phase. Now, the phase interpolation method does not guarantee in principle that the phase intervals of the multi-phase clock signals are maintained with high precision.

Furthermore, inasmuch as the above-mentioned phase interpolation method regards, as a sine wave, the clock signal which is a rectangular wave in practice on the basis of a principle such that "a sine wave having any phase is obtained by multiplying two sine waves weighted and adding them", a clock signal in theory is not synthesized and distortion occurs in a synthesized wave. As a result, it is difficult to synthesize the clock signal so as to stand practically.

SUMMARY OF THE INVENTION

It is therefore an object of this invention to provide a digital phase control method and a digital phase control circuit which are capable of phase shifting a predetermined number of clock signals having the same frequency and having different phases with high precision and at high resolution as a whole with those phase intervals maintained to keep a predetermined interval.

It is another object of this invention to provide a digital phase control circuit of the type described, which is capable of realizing such a digital phase control circuit with a low consumed power and with a small circuit's scale.

It is still another object of this invention to provide a digital phase control method and a digital phase control circuit which are capable of generating a clock signal of high quality with a well-ordered wave.

It is yet another object of this invention to provide a digital phase control method and a digital phase control circuit which are capable of giving full play to performance upon normal design.

Other objects of this invention will become clear as the description proceeds.

According to a first aspect of this invention, a digital phase control method comprises the steps of preparing first multi-phase clock signals having a fixed phase and having a first equal phase interval, of preparing second multi-phase clock signals having a second equal phase interval different from the first equal phase interval, of phase locking a specific clock signal in the first multi-phase clock signals and a particular clock signal in the second multi-phase clock signals, and of changing a combination of the specific and the particular clock signals to be phase-locked to shift a phase of the second multi-phase clock signals.

Among through the specification, a "phase interval" means a phase difference between two adjacent clock signals among multi-phase clock signals. The multi-phase clock signals having an equal phase interval may be generated by using, for example, an analog delay locked loop (DLL). In addition, the "multi-phase clock signals" mean a predetermined number of clock signals having the same frequency and having different phases.

According to a second aspect of this invention, a digital phase control method comprising the steps of generating first multi-phase clock signals having a fixed phase and having a first equal phase interval using a first delay line comprising a plurality of primary delay buffers which are chained with each other, of selecting one of the first multi-phase clock signal to pick up a selected clock signal, and of supplying the selected clock signal to one of secondary delay buffers chained with each other in a second delay line to generate second multi-phase clock signals having a second equal phase interval different from the first equal phase interval using the second delay line.

In the digital phase control method according to the second aspect of this invention, the secondary delay buffers of the second delay line may be chained with each other in a ring-shaped fashion. In addition, the first delay line may be feedback controlled by a first delay locked loop and said second delay line may be feedback controlled by a second delay locked loop.

According to a third aspect of this invention, a digital phase control circuit comprises a first delay line comprising M primary delay buffers which are chained with each other where M represents a first positive integer which is not less than two. The first delay line is feedback controlled by a first delay locked loop to produce first through M-th primary delay output signals. A delay buffer train comprises N or more secondary delay buffers which are chained with each other where N represents a second positive integer which is not less than two and which is different from the first positive integer M. A first selection circuit selects one of the first through the M-th primary delay output signals as a selected primary delay output signal. A second selection circuit selects one of the N or more secondary delay buffers as a first stage of a second delay line in the delay buffer train to supply the selected primary delay output signal to the first stage. The second delay line comprises N successive secondary delay buffers having a first one of the N successive secondary delay buffers as the first stage. A second delay locked loop feedback controls the second delay line.

In the digital phase control circuit according to the third aspect of this invention, the N or more secondary delay buffers of the delay buffer train may be chained with each other in a ring-shaped fashion. In addition, each of the M primary delay buffers and the N or more secondary delay buffers may have a single-phase configuration or may have a differential configuration. In the differential configuration, the first delay line produces first though M-th primary differential clock signal pairs as the first through the M-th primary delay output signals and the first selection circuit produces a selected primary differential clock pair as the selected primary delay output signal. The digital phase control circuit further may comprise a switching circuit for switching inversion and non-inversion of the selected primary differential clock pair.

According to a fourth aspect of this invention, a digital phase control circuit comprises a first delay line comprising M primary delay buffers which are chained with each other where M represents a first positive integer which is not less than two. The first delay line is feedback controlled by a first delay locked loop to produce first through M-th primary delay output signals. A delay buffer train comprising N secondary delay buffers which are chained with each other in a ring-shaped fashion where N represents a second positive integer which is not less than two and which is different from the first positive integer M. N first-stage delay buffers have outputs connected between respective adjacent two of the N secondary delay buffers. Each of the N first-stage delay buffers has similar characteristics of each of the N secondary delay buffers. A first selection circuit selects one of the first through the M-th primary delay output signals as a selected primary delay output signal. Connected to inputs of the N first-stage delay buffers in parallel, a second selection circuit selects one of the N first-stage delay buffers as a selected first-stage delay buffer of a second delay line to supply the selected primary delay output signal to the selected first-stage delay buffer. The second delay line comprises the selected first-stage delay buffer and (N–1) successive secondary delay buffers following the selected first-stage delay buffer. A second delay locked loop feedback controls the second delay line.

In the digital phase control circuit according to the fourth aspect of this invention, each of the M primary delay buffers, the N secondary delay buffers, and the N first-stage delay buffers may have a single-phase configuration or a differential configuration. In the differential configuration, the first delay line produces first though M-th primary differential clock signal pairs as the first through the M-th primary delay output signals, and the first selection circuit produces a selected primary differential clock pair as the selected primary delay output signal. The digital phase control circuit further may comprise a switching circuit for switching inversion and non-inversion of the selected primary differential clock signal pair to produce a passed primary differential clock signal pair which is supplied to the second selection circuit.

According to a fifth aspect of this invention, a delay locked loop comprises a delay buffer train comprising a plurality of delay buffers which are chained with each other in a ring-shaped fashion and means for configuring a delay line comprising one of the delay buffers or successive delay buffers.

According to a sixth aspect of this invention, a delay locked loop comprises a delay buffer train comprising a plurality of delay buffers which are chained with each other in a ring-shaped fashion, means for activating a delay line comprising a predetermined number of the delay buffers which circulate in the delay buffer train in position, and means for detecting a phase difference between an input signal and an output signal of the delay line to feedback control the delay line.

According to a seventh aspect of this invention, a delay locked loop comprises a delay buffer train comprising a plurality of delay buffers which are chained with each other in a ring-shaped fashion, a selection circuit for selecting one of the delay buffer as a selected delay buffer to be first supplied with a clock signal, and means for feedback controlling a delay line comprising the selected delay buffer and successive delay buffers following the selected delay buffer in the delay buffer train.

In the delay locked loop according to each of the fifth through the seventh aspects of this invention, the delay locked loop further may comprise means for cutting off propagation of a signal flowing in the delay buffer train.

DESCRIPTION OF THE PREFERRED EMBODIMENTS

Figure 1A:
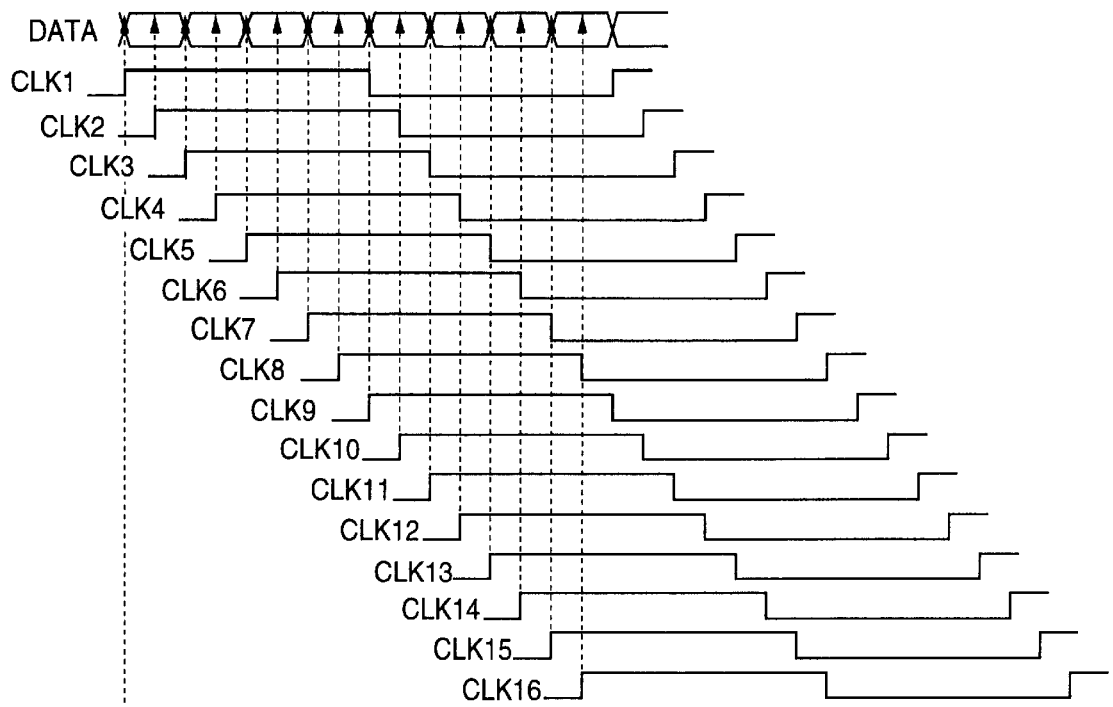
FIGS. 1A and 1B show time charts schematically showing waveforms of data and clock signals in a clock recovery of an over-sampling system.
Figure 1B:
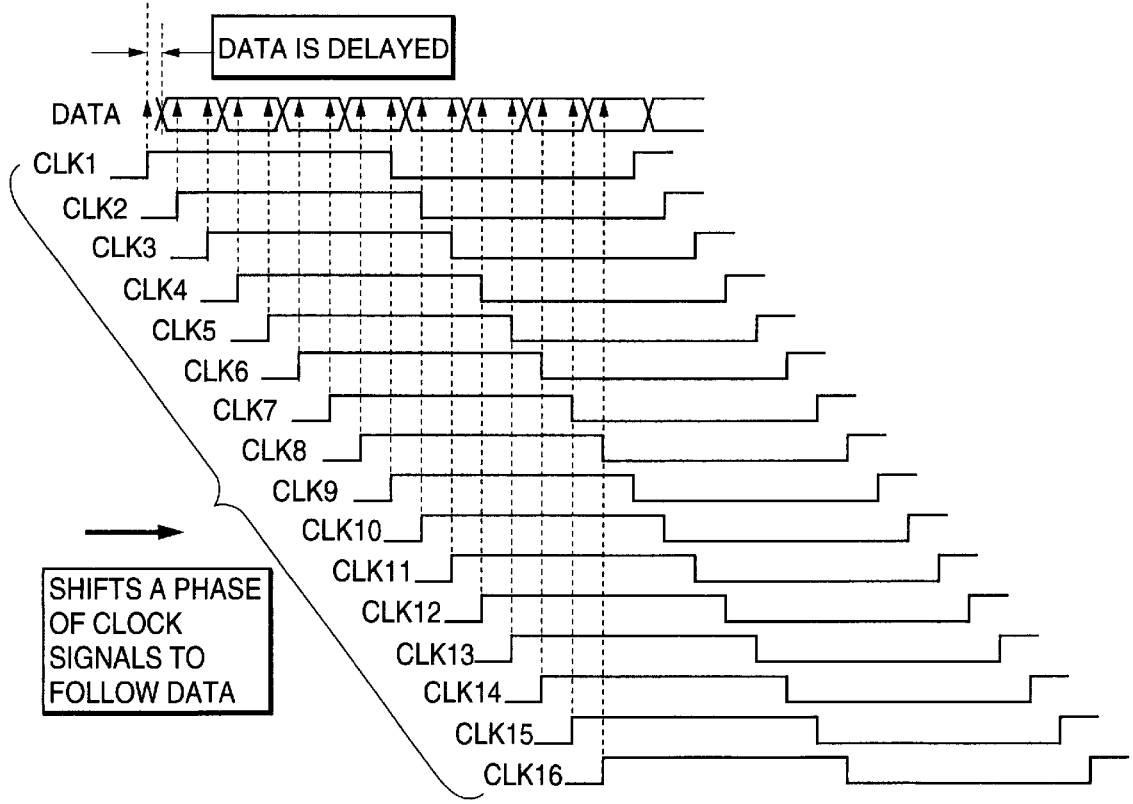

Referring to FIGS. 1A and 1B, description will at first be directed to clock recovery of an over-sampling system to facilitate an understanding of this invention. Each of FIGS. 1A and 1B is a time chart schematically showing waveforms of data and clock signals in the clock recovery of the over-sampling system.

In the over-sampling clock recovery illustrated in FIGS. 1A and 1B, a phase comparison is carried out by making two leading edges of multi-phase clock signals CLK1, CLK2, . . . , and CLK16 of sixteen phases having the same frequency and having different phases correspond to 1-bit data. The over-sampling clock recovery uses the clock signals each having a frequency lower than data rate. That is, the over-sampling clock recovery can use the clock signals each having a relatively lower clock frequency although data has higher data rate. Accordingly, it is possible for the over-sampling clock recovery to respond to a demand of a high-speed data transmission.

As shown in FIG. 1A, the clock signals CLK2, CLK4, . . . , and CLK12 having even number match with center portions of rectangular waves of the data in stable. This is a state where the data signal and the clock signals synchronize with each other.

However, it will be assumed that the data signal shifts in a lag direction or a lead direction caused by jitter or the like as illustrated in FIG. 1B. In this event, the multi-phase clock signals CLK1 to CLK16 must be shifted as a whole with those phase intervals maintained so as to make the clock signals follow the data signal. That is, in the over-sampling clock recovery, in order to make the multi-phase clock signals follow the data signal at a high resolution and at a high precision in response to a flicker caused by jitter or the like of the data signal transmitted at a high speed, it is required to phase shift (phase control) the multi-phase clock signals as a whole with the phase intervals of the multi-phase clock signals maintained to keep equally.

As one of conventional phase control methods, a phase interpolation method is known in the art. The phase interpolation method is a method of synthesize given two clock signals having different phases to obtain a synthesized clock signal having a phase between the different phases.

Figure 2:
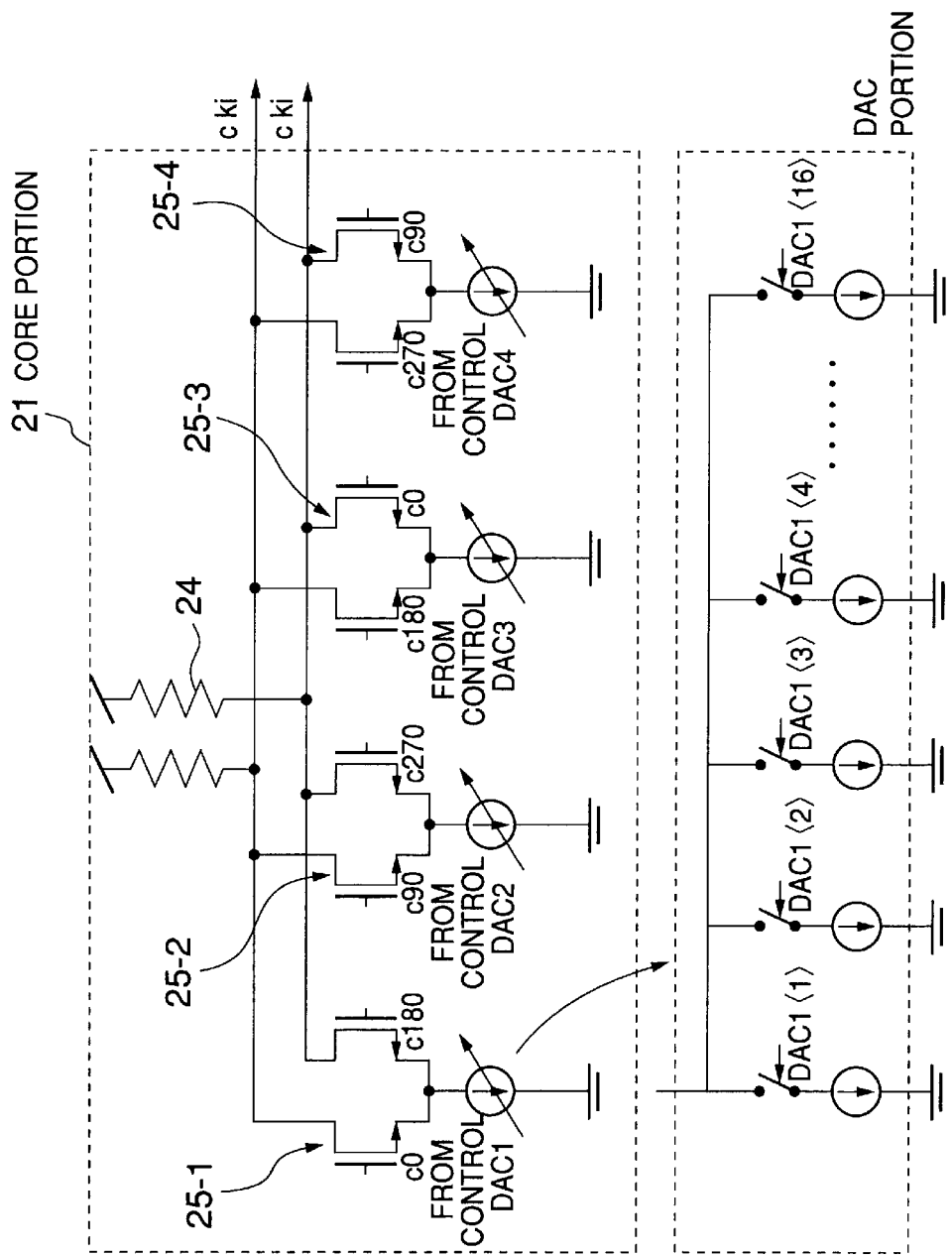
FIG. 2 is a schematic circuit diagram of a conventional core portion of a conventional phase interpolator.
Figure 3:
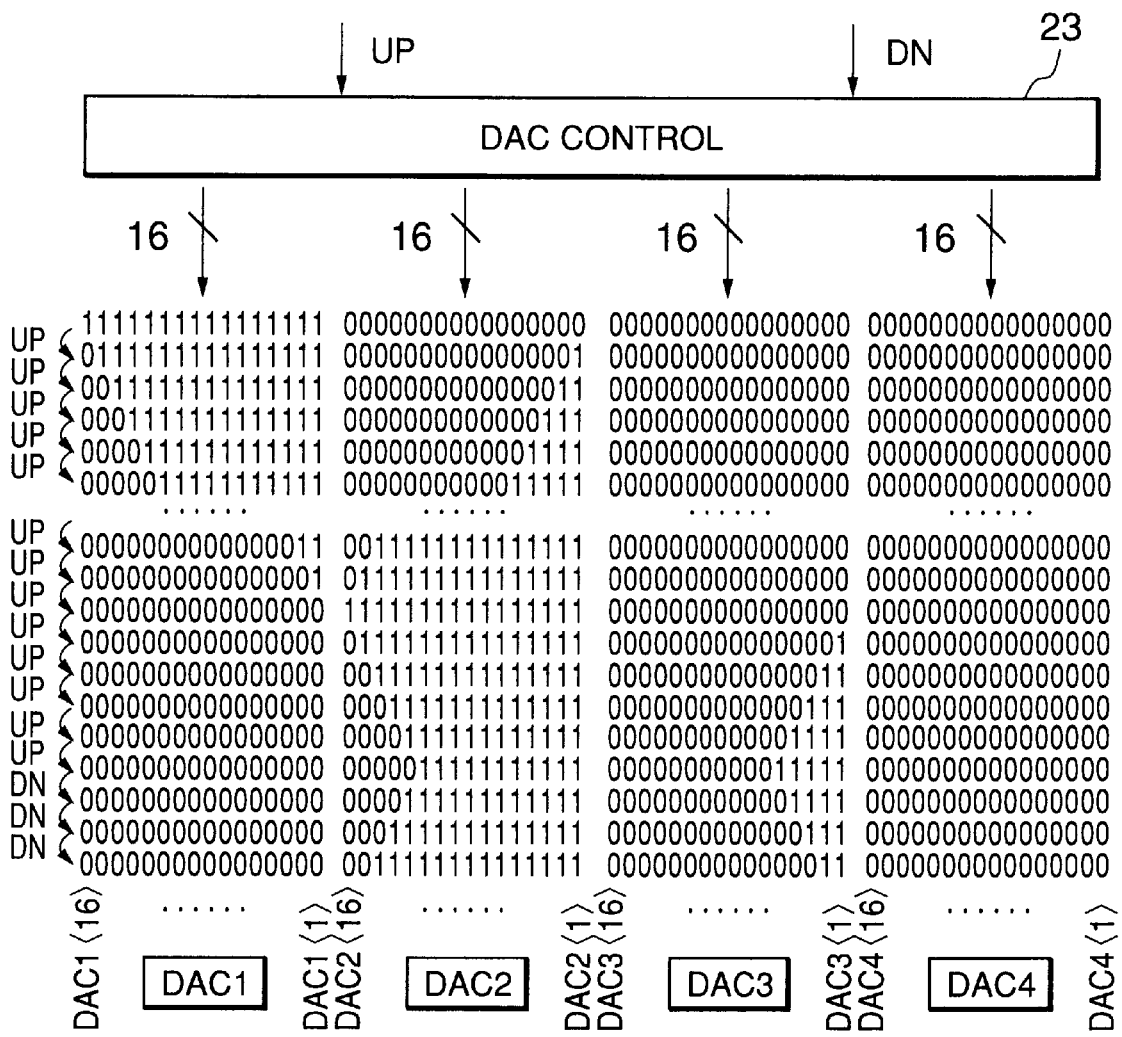
FIG. 3 is a schematic view showing a conventional DAC controller and an example of selection signals.

Referring to FIGS. 2 and 3, a conventional digital phase control method according to the phase interpolation method will be described at first in order to facilitate an understanding of the present invention. FIG. 2 is a schematic circuit diagram of a conventional core portion 21 of a conventional phase interpolator. FIG. 3 is a schematic view showing a conventional DAC controller 23 and an example of selection signals.

The phase interpolator generally comprises the core portion 21 and a filter portion (not shown). The core portion 21 comprises analog multipliers and is for synthesizing a clock signal. The filter portion is for shaping the clock signal generated by the core portion 21.

As shown in FIG. 2, the core portion 21 comprises first through fourth metal oxide semiconductor (MOS) differential pairs 25-1, 25-2, 25-3, and 25-4. Each of the first through the fourth MOS differential pairs 25-1 to 25-4 has a drain connected to a resistor 24 in common. The first through the fourth MOS differential pairs 25-1 to 25-4 have sources connected to first through fourth digital-to-analog (D/A) converters DAC1, DAC2, DAC3, and DAC 4, respectively. Each of the first through the fourth D/A converters DAC1 to DAC4 comprises sixteen sub-current sources which are selectively applicable.

The core portion 21 is supplied from an external phase locked loop (PLL) with a 0° clock signal c0, a 90° clock signal c90, a 180° clock signal c180, and a 270° clock signal c270. As shown in FIG. 2, the first MOS differential pair 25-1 is supplied with differential clock signals consisting of the 0° clock signal c0 and the 180° clock signal c180. The second MOS differential pair 25-2 is supplied with differential clock signals consisting of the 90° clock signal c90 and the 270° clock signal c270. The third MOS differential pair 25-3 is supplied with differential clock signals consisting of the 180° clock signal c180 and the 0° clock signal c0. The fourth MOS differential pair 25-4 is supplied with differential clock signals consisting of the 270° clock signal c270 and the 90° clock signal c90.

Synthesis of the clock signal having a phase between 0° and 90° is carried out by using the first D/A converter DAC1 and the second D/A converter DAC2. Synthesis of the clock signal having a phase between 90° and 180° is carried out by using the second D/A converter DAC2 and the third D/A converter DAC3. Synthesis of the clock signal having a phase between 180° and 270° is carried out by using the third D/A converter DAC3 and the fourth D/A converter DAC4. Synthesis of the clock signal having a phase between 270° and 360° is carried out by using the fourth D/A converter DAC4 and the first D/A converter DAC1.

Now, the description will be made as regards principle of a synthesizing method of the clock signal carried out by the core portion 21 in a case of synthesizing the clock signal having the phase between 0° and 90°.

Any sine wave may be synthesized using two sine waves. For example, the clock signal having any phase $y°$ between 0° and 90° may be synthesized by superimposing the 0° clock signal c0 and the 90° clock signal c90 and is represented by a following equation (1), that is:

$$y°: \sin\{(x-y)\pi/180\} = A0 \cdot \sin\{(x-0)\pi/180\} + A90 \cdot \sin\{(x-90)\pi/180\}. \quad (1)$$

By substituting x=0, x=90 into the equation (1), coefficients A0 and A90 are calculated as follows:

$$A0 = \sin\{(90-y)\pi/180\}, \quad A90 = \sin\{y\pi/180\}.$$

The core portion 21 generates, on the basis of the above-mentioned principle, the clock signal having any phase $y°$ between 0° and 90° by approximately replacing the clock signal with the sine wave, by matching a ratio of a current value of the first D/A converter DAC1 to a current value of the second D/A converter DAC2 with a ratio of A0 to A90, and by controlling the respective sixteen sub-current sources of the first and the second D/A converters DAC1 and DAC2 to change the current values.

Control of the respective sub-current sources (weighing of the current sources) of the first through the fourth D/A converters DAC1 to DAC4 is carried out by the DAC controller 23 illustrated in FIG. 3. The DAC controller 23 is supplied with an UP signal and a DOWN signal which are generated by a phase comparator (not shown) and which is carried out a predetermined processing in an ACR filter (not shown). Responsive to the UP signal or the DOWN signal, the DAC controller 23 generates a 16-digits selection signal for each of the first through the fourth D/A converters DAC1 to DAC4 as shown in FIG. 3 to control the respective sixteen sub-current sources of the first through the fourth D/A converters DAC1 to DAC4. The respective sixteen sub-current sources of the first through the fourth D/A converters DAC1 to DAC4 are put into a nonselected state or a selected state in response to a 0/1 signal. In the manner as described above, the weighting of the current sources is carried out, weighted multiplication of two clock signals is carried out through each of the first through the fourth MOS differential pairs 25-1 to 25-4, and the clock signal having any phase is generated.

As described above, the clock signals having four phases of 0°, 90°, 180°, and 270° are used, those phases are multiplied by the analog multipliers with each phase weighted in current, and the clock signal having any phase is generated. This is based on the principle such that "a sine wave having any phase is obtained by multiplying two sine waves with weighted and by adding them." In addition, this prior art has structure for obtaining a differential clock signal.

The phase interpolation method based on such a principle is utilized in WO 95/22206.

According to the phase interpolation method, it is possible to carry out digital phase control at high resolution. If weighting is carried out by using a 16-digits digital signal in the manner as the above-mentioned example, it is possible to carry out phase control at resolution of 90°/16=5.625° (25 ps when the clock frequency is equal to 625 MHz).

However, the digital phase control according to the above-mentioned phase interpolation method has problems which are presently be described.

It is necessary for the above-mentioned phase interpolation method to use the clock signals with four phases of 0°, 90°, 180° and 270°.

In addition, in order to obtain the clock signal having one phase where phase control with high precision is carried out, the core portion 21 comprises four analog multipliers each having current sources. Furthermore, in a case of carrying out phase control of multi-phase clock signals, the phase interpolator comprises a plurality of core portions which are equal in number to phase number of the multi-phase clock signals. For example, in a case of controlling the multi-phase clock signals with sixteen phases, the phase interpolator must comprises 4×16=64 analog multipliers.

Accordingly, in a case of applying the phase interpolation method to phase control of multi-phase clock signals, increase of consumed power and circuit's scale is problem, as mentioned in the preamble of the instant specification.

The above-mentioned phase interpolation method is for phase controlling only the clock signal with one phase and is suitable to phase control the clock signal with one phase with high precision. That is, the phase interpolation method is not technique on the premise that phase control of the multi-phase clock signals is carried out. In a case of applying the phase interpolation method to the phase control of the multi-phase clock signals, the phase interpolator must comprise core portions which are equal in number to phase number. With this structure, although each core portion phase shifts with high precision, the core portions are controlled independently and each core portion is not controlled to make a phase difference to other core portions a desired phase difference. Accordingly, a phase difference (phase interval) between one clock signal and another clock signal may be disordered and there is no mechanism for compensating disorder when the disorder occurs. That is, in a case of applying the phase interpolation method to the phase control of the multi-phase clock signals, the phase interpolator has no mechanism for maintaining the phase intervals of the multi-phase clock signals to keep a desired interval with high precision and is not suitable for control of the multi-phase clock signals. Well, in the phase interpolation method, it is not guaranteed in principle that the phase intervals of the multi-phase clock signals are maintained to keep the desired interval with high precision, as also mentioned in the preamble of the instant specification.

Furthermore, inasmuch as the above-mentioned phase interpolation method regards, as a sine wave, the clock signal which is a rectangular wave in practice on the basis of a principle such that "a sine wave having any phase is obtained by multiplying two sine waves weighted and adding them", a clock signal in theory is not synthesized and distortion occurs in a synthesized wave. As a result, it is difficult to synthesize the clock signal so as to stand practically, as also mentioned in the preamble of the instant specification. Accordingly, it is essential for the phase interpolator to shape the synthesized wave by the filter portion as described above and it results in a burden for designing the filter portion. If the filter portion is composed of analog filters, it is difficult for the analog filter to set constants. If the filter portion is composed of digital filters, high technique is required to design the digital filter. At any rate, high design ability (excessive design burden) is required. In addition, inasmuch as phase control depends on analog change in the core portion 21 of the phase interpolator, precision of the analog multiplier (the core portion 21) is important to obtain the clock signal having good quality and the high design ability (excessive design burden) is required also in design of the analog multiplier.

As a result, the above-mentioned prior art is disadvantageous in that it is very difficult to phase shift a predetermined number of clock signals (multi-phase clock signals) having the same frequency and having different phases with high precision and at high resolution as a whole with phase intervals between the multi-phase clock signals maintained to keep a predetermined interval. In addition, the above-mentioned prior art is disadvantageous in that increase of consumed power and circuit's scale is feared and high design ability is required.

In prior art, there is no other technique to solve those problems.

Figures 4, 5:
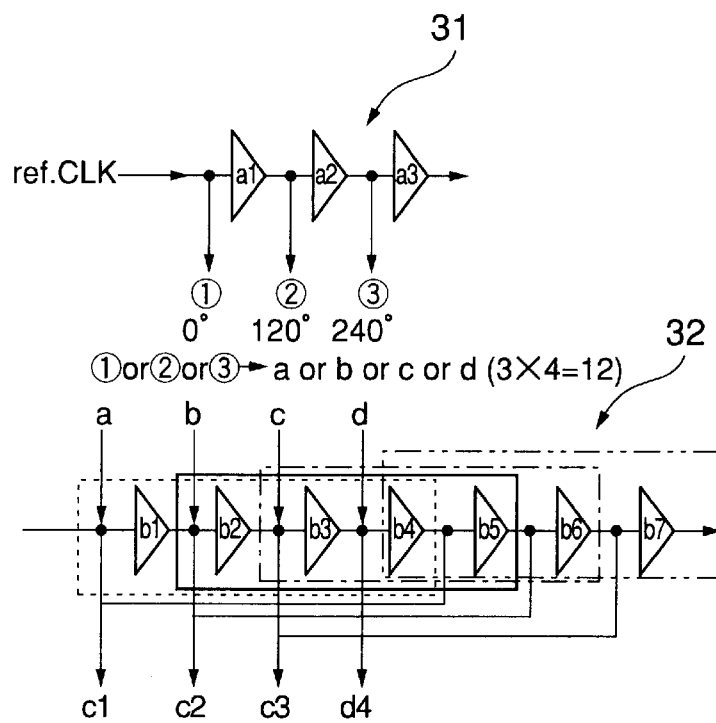
FIG. 4 is a circuit diagram of a digital phase control circuit according to a first embodiment of this invention.
FIG. 5 is a view for use in describing operation of the digital phase control circuit illustrated in FIG. 4.
Figure 6:
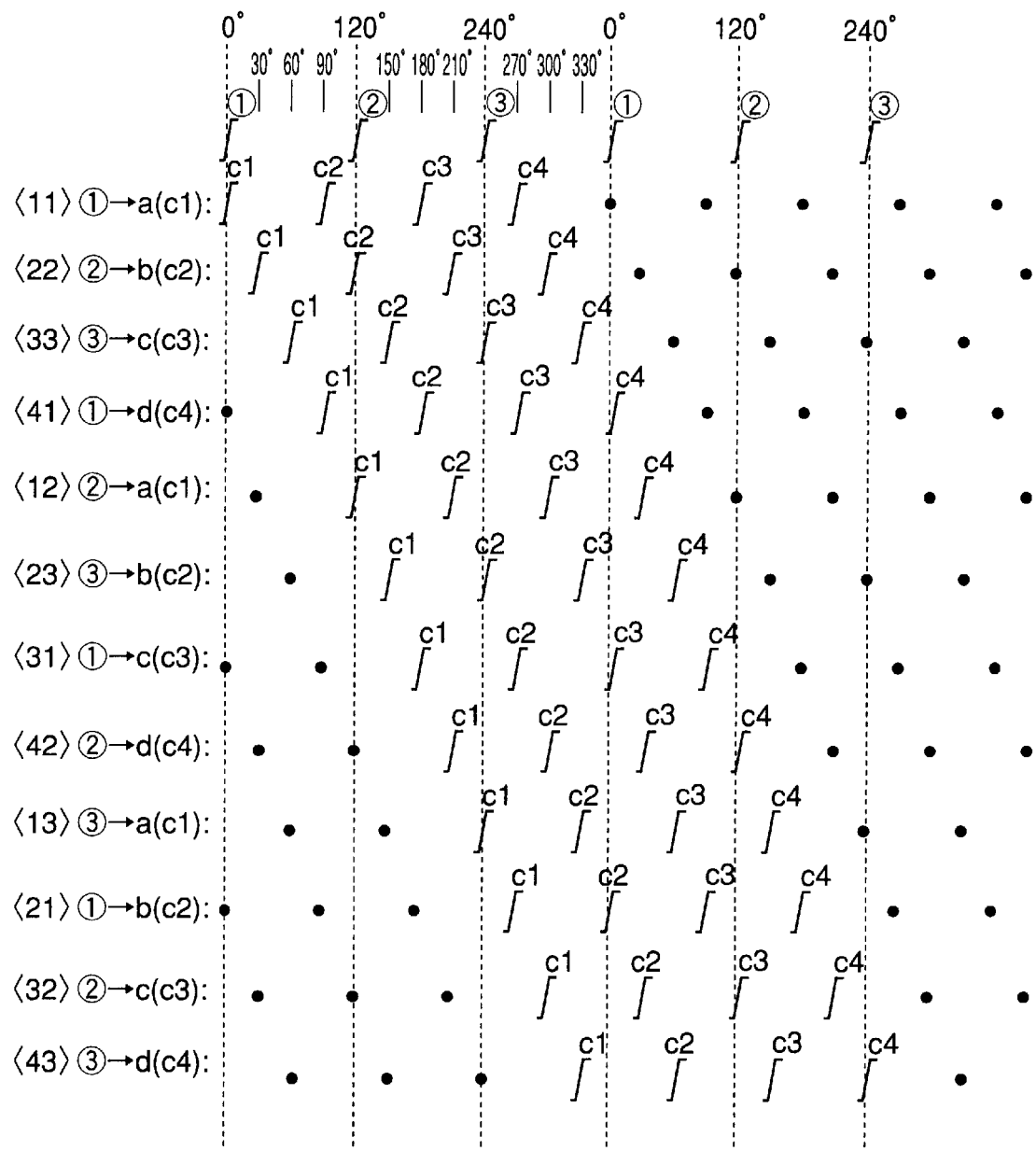
FIG. 6 is a time chart showing schematic waveforms indicating position relationship of clock edges in the digital phase control circuit illustrated in FIG. 4.

Referring to FIGS. 4, 5, and 6, the description will proceed to a digital phase control method and a digital phase control circuit according to a first embodiment of this invention. FIG. 4 is a circuit diagram of the digital phase control circuit according to the first embodiment of this invention. FIG. 5 is a view for use in describing operation of the digital phase control circuit illustrated in FIG. 4. FIG. 6 is a time chart showing schematic waveforms indicating position relationship of clock edges in the digital phase control circuit illustrated in FIG. 4.

As shown in FIG. 4, the digital phase control circuit comprises a first delay line 31 and a delay buffer train 32. The first delay line 31 comprises a three-stage primary delay buffer, namely, first through third primary delay buffers a1, a2, and a3 which are chained with each other. Each of the first through the third primary delay buffers a1 to a3 has an equal primary characteristic. The first delay line 31 is feedback controlled by a first delay locked loop (DLL) (not shown). The delay buffer train 32 comprises a seven-stage secondary delay buffer, namely, first through seventh secondary delay buffers b1, b2, b3, b4, b5, b6, and b7 which are chained with each other. Each of the first through the seventh secondary delay buffers b1 to b7 has an equal secondary characteristic.

The first delay line 31 is supplied with a reference clock signal ref.CLK as an input signal. The reference clock signal ref.CLK is supplied to the first primary delay buffer a1. The first delay line 31 produces a first total delayed signal as an output signal. The input signal and the output signal are supplied to the first delay locked loop. The first delay locked loop phase compares the input signal with the output signal to phase lock the input signal and the output signal. The first delay locked loop supplies the first through the third primary delay buffers a1 to a3 with a first control voltage in common so that a primary total delay time of the first delay line 31 is equal to one period of the reference clock signal ref.CLK to feedback control the first delay line 31. When the primary total delay time of the first delay line 31 is fixed to one period of the reference clock signal ref.CLK by the first delay locked loop, the first delay line 31 produces first through third primary delay output signals each of which has a first propagation delay equal to a third of the period of the reference clock signal ref.CLK and which are phase shifted by 120° because each of the first through the third primary delay buffers a1 to a3 has the equal characteristic. As described above, the first delay line 31 generates three first multi-phase clock signals having a fixed phase and having a first equal phase interval of 120°. As shown in FIG. 4, the three first multi-phase clock signals or the first through the third primary delay output signals are depicted at ①, ②, and ③ in order, respectively. When the first primary delay output signal ① has a phase of 0°, the second primary delay output signal ② has a phase of 120° and the third primary delay output signal ③ has a phase of 240°.

The delay buffer train 32 has first through fourth input nodes a, b, c, and d which are selectively supplied with one of the first through the third primary delay output signals ①, ②, and ③ from the first delay line 31. The delay buffer train 32 is classified into first through fourth delay secondary buffer groups each of which comprises four successive secondary delay buffers having a first stage secondary delay buffer directly supplied with one of the first through the third primary delay output signals ①, ②, and ③.

More specifically, the first delay secondary buffer group consists of the first through the fourth secondary delay buffers b1 to b4. The second delay secondary buffer group consists of the second through the fifth secondary delay buffers b2 to b5. The third delay secondary buffer group consists of the third through the sixth secondary delay buffers b3 to b6. The fourth delay secondary buffer group consists of the fourth through the seventh secondary delay buffers b4 to b7. Each of the first through the fourth secondary buffer groups is feedback controlled by a second delay locked loop (not shown) so that a second total delay time is equal to one period of the reference clock signal ref.CLK.

In the delay buffer train 32, only one of the first through the fourth secondary buffer groups is activated or used as an active secondary buffer group or a second delay line which generates four second multi-phase clock signals c1, c2, c3, and c4 having a second equal phase interval of 90° different from the first equal phase interval in the three first multi-phase clock signals ①, ②, and ③. The four second multi-phase clock signals c1 to c4 are called first through fourth secondary delay output signals, respectively.

As shown in FIG. 4, the fourth secondary delay buffer b4 has an output terminal connected to a first output node for producing the first secondary delay output signal c1. The fifth secondary delay buffer b5 has an output terminal connected to a second output node for producing the second secondary delay output signal c2. The sixth secondary delay buffer b6 has an output terminal connected to a third output node for producing the third secondary delay output signal c3. If such connections are not made, there is disadvantage in the manner which will be presently described. When the second delay secondary buffer group (b2 to b5) is activated as the active secondary buffer group or the second delay line, it is impossible to produce the first secondary delay output signal c1. When the third delay secondary buffer group (b3 to b6) is activated as the active secondary buffer group or the second delay line, it is impossible to produce the first and the second secondary delay output signals c1 and c2. When the fourth delay secondary buffer group (b4 to b7) is activated as the active secondary buffer group or the second delay line, it is impossible to produce the first through the third secondary delay output signals c1 to c3. That is, the first through the third secondary delay output signals c1 to c3 may be omitted in a supplied side of the clock signals and the supplied side cannot always receive the four second multi-phase clock signals c1 to c4.

The four second multi-phase clock signals c1 to c4 are phase shifted as a whole in the manner which will be described as the description proceeds.

In the first embodiment, one of the first through the third primary delay output signals ①, ②, and ③ is selected as a selected primary delay output signal and the selected primary delay output signal is supplied to one of the first through the fourth input nodes a, b, c, and d of the delay buffer train 32. In order to phase shift the four second multi-phase clock signals c1 to c4 by a range between 0° and 360° or by one period as a whole with the second phase interval of the four second multi-phase clock signals c1 to c4 maintained to keep 90°, a combination of 3×4 or twelve is required. In this event, resolution of the phase control is equal to 360°/12=30°.

As shown in FIG. 5, the digital phase control circuit illustrated in FIG. 4 has first through twelfth synchronization states <11>, <12>, <13>, <21>, <22>, <23>, <31>, <32>, <33>, <41>, <42>, and <43>. The first synchronization state <11> is a state where the first primary delay output signal ① is supplied to the first input node a of the delay buffer train 32. The second synchronization state <12> is a state where the second primary delay output signal ② is supplied to the first input node a of the delay buffer train 32. The third synchronization state <13> is a state where the third primary delay output signal ③ is supplied to the first input node a of the delay buffer train 32. The fourth synchronization state <21> is a state where the first primary delay output signal ① is supplied to the second input node b of the delay buffer train 32. The fifth synchronization state <22> is a state where the second primary delay output signal ② is supplied to the second input node b of the delay buffer train 32. The sixth synchronization state <23> is a state where the third primary delay output signal ③ is supplied to the second input node b of the delay buffer train 32.

The seventh synchronization state <31> is a state where the first primary delay output signal ① is supplied to the third input node c of the delay buffer train 32. The eighth synchronization state <32> is a state where the second primary delay output signal ② is supplied to the third input node c of the delay buffer train 32. The ninth synchronization state <33> is a state where the third primary delay output signal ③ is supplied to the third input node c of the delay buffer train 32. The tenth synchronization state <41> is a state where the first primary delay output signal ① is supplied to the fourth input node d of the delay buffer train 32. The eleventh synchronization state <42> is a state where the second primary delay output signal ② is supplied to the fourth input node d of the delay buffer train 32. The twelfth synchronization state <43> is a state where the third primary delay output signal ③ is supplied to the fourth input node d of the delay buffer train 32.

In the first synchronization state <11> where the first primary delay output signal ② is supplied to the first input node a of the delay buffer train 32, the first primary delay output signal ① and the first secondary delay output signal c1 are phase-locked with each other and the four second multi-phase clock signals c1 to c4 have phases of 0°, 90°, 180°, and 270° in this order.

In the second synchronization state <12> where the second primary delay output signal ② is supplied to the first input node a of the delay buffer train 32, the second primary delay output signal ② and the first secondary delay output signal c1 are phase-locked with each other and the four second multi-phase clock signals c1 to c4 have phases of 120°, 210°, 300°, and 30° in this order.

In the third synchronization state <13> where the third primary delay output signal ③ is supplied to the first input node a of the delay buffer train 32, the third primary delay output signal ③ and the first secondary delay output signal c1 are phase-locked with each other and the four second multi-phase clock signals c1 to c4 have phases of 240°, 330°, 60°, and 150° in this order.

In the fourth synchronization state <21> where the first primary delay output signal ① is supplied to the second input node b of the delay buffer train 32, the first primary delay output signal ① and the second secondary delay output signal c2 are phase-locked with each other and the four second multi-phase clock signals c1 to c4 have phases of 270°, 0°, 90°, and 180° in this order.

In the fifth synchronization state <22> where the second primary delay output signal ② is supplied to the second input node b of the delay buffer train 32, the second primary delay output signal ② and the second secondary delay output signal c2 are phase-locked with each other and the four second multi-phase clock signals c1 to c4 have phases of 30°, 120°, 210°, and 300° in this order.

In the sixth synchronization state <23> where the third primary delay output signal ③ is supplied to the second input node b of the delay buffer train 32, the third primary delay output signal ③ and the second secondary delay output signal c2 are phase-locked with each other and the second multi-phase clock signals c1 to c4 have phases of 150°, 240°, 330°, and 60° in this order.

In the seventh synchronization state <31> where the first primary delay output signal ① is supplied to the third input node c of the delay buffer train 32, the first primary delay output signal ① and the third secondary delay output signal c3 are phase-locked with each other and the second multi-phase clock signals c1 to c4 have phases of 180°, 270°, 0°, and 90° in this order.

In the eighth synchronization state <32> where the second primary delay output signal ② is supplied to the third input node c of the delay buffer train 32, the second primary delay output signal ② and the third secondary delay output signal c3 are phase-locked with each other and the second multi-phase clock signals c1 to c4 have phases of 300°, 30°, 120°, and 210° in this order.

In the ninth synchronization state <33> where the third primary delay output signal ③ is supplied to the third input node c of the delay buffer train 32, the third primary delay output signal ③ and the third secondary delay output signal c3 are phase-locked with each other and the second multi-phase clock signals c1 to c4 have phases of 60°, 150°, 240°, and 330° in this order.

In the tenth synchronization state <41> where the first primary delay output signal ① is supplied to the fourth input node d of the delay buffer train 32, the first primary delay output signal ① and the fourth secondary delay output signal c4 are phase-locked with each other and the second multi-phase clock signals c1 to c4 have phases of 90°, 180°, 270°, and 0° in this order.

In the eleventh synchronization state <42> where the second primary delay output signal ② is supplied to the fourth input node d of the delay buffer train 32, the second primary delay output signal ② and the fourth secondary delay output signal c4 are phase-locked with each other and the second multi-phase clock signals c1 to c4 have phases of 210°, 300°, 30°, and 120° in this order.

In the twelfth synchronization state <43> where the third primary delay output signal ③ is supplied to the fourth input node d of the delay buffer train 32, the third primary delay output signal ③ and the fourth secondary delay output signal c4 are phase-locked with each other and the second multi-phase clock signals c1 to c4 have phases of 330°, 60°, 150°, and 240° in this order.

In the manner which is described above, the four second multi-phase clock signals c1 to c4 are phase shifted by changing the combination of the three first multi-phase clock signals ①, ②, and ③ and the four second multi-phase clock signals c1 to c4.

It is possible for the digital phase control circuit to successively phase shift the four second multi-phase clock signals c1 to c4 by 30° by changing the above-mentioned combination in order of the first synchronization state <11>→the fifth synchronization state <22>→the ninth synchronization state <33>→the tenth synchronization state <41>→the second synchronization state <12>→the sixth synchronization state <23>→the seventh synchronization state <31>→the eleventh synchronization state <42>→the third synchronization state <13>→the fourth synchronization state <21>→the eighth synchronization state <32>→the twelfth synchronization state <43>→or the reverse order. In other words, it is possible for the digital phase control circuit to successively phase shift the four second multi-phase clock signals c1 to c4 by 30° by changing the above-mentioned combination for the clock signals to be phase-locked at a cycle of ①→②→③ as regards the three first multi-phase clock signal and a cycle of c1→c2→c3→c4 as regards the four second multi-phase clock signals.

In addition, it is possible to shift the phase at the resolution of 30° by changing to any synchronization state. This state can be confirmed with reference to FIG. 6. Attention will be directed to the first synchronization state <11>. In the first synchronization state <11>, a leading edge of the first primary delay output signal ① and a leading edge of the first secondary delay output signal c1 have the same phase. In addition, in the first synchronization state <11>, there is a phase difference of 30° between a leading edge of the second primary delay output signal ② and a leading edge of the second secondary delay output signal c2. This is because the three first multi-phase clock signals ①, ②, and ③ have the first phase interval of 120° while the four second multi-phase clock signals c1 to c4 have the second phase interval of 90°.

On the other hand, in the fifth synchronization state <22>, the leading edge of the second primary delay output signal ② and the leading edge of the second secondary delay output signal c2 have the same phase.

Accordingly, by changing from the first synchronization state <11> to the fifth synchronization state <22>, the phase of the four second multi-phase clock signals c1 to c4 is shifted by 30° rightwards in the drawing or delayed by 30°. This is a principle of this invention. From this fact, it is understood that the resolution is equal to 30°.

It is noted that the resolution of 30° is achieved although the three first multi-phase clock signals ①, ②, and ③ have the first phase interval of 120° and the four second multi-phase clock signals c1 to c4 have the second phase interval of 90°. In other words, in order to obtain the resolution of 30°, it is unnecessary to make a phase interval of multi-phase clock signals a narrow pitch up to 30°. It is unnecessary to constitute buffers each having a relatively smaller (shorter) propagation delay of 30° in terms of phase and it is sufficient to constitute buffers each having a relatively larger (longer) propagation delay of 120° or 90° in terms of phase. As a result, it is possible to easily realize a minute resolution in comparison with the propagation delay of the buffers. Inasmuch as technique for miniaturizing the propagation delay of the buffers is limited at the times, technique according to this invention does a major service in this sense to realize the minute resolution in comparison with the propagation delay time interval of the buffers.

Although the phase numbers of the multi-phase clock signals are equal to three and four in the above-mentioned first embodiment in order to facilitate an understanding thereof, the phase numbers of the multi-phase clock signals are restricted to them. That is, it is possible to improve the resolution by combining the first multi-phase clock signals with the second multi-phase clock signals both having the same frequency and having more phase number (narrower phase interval). In other words, the first delay line 31 may comprise M primary delay buffers which are chained with each other where M represents a first positive integer which is not less than two. The delay buffer train 32 may comprise N or more secondary delay buffers which are chained with each other where N represents a second positive integer which is not less than two and which is different from the first positive integer M. In this event, the second delay line may comprise N successive secondary delay buffers having a first one of the N successive secondary delay buffers as the first stage.

Figures 7, 8:
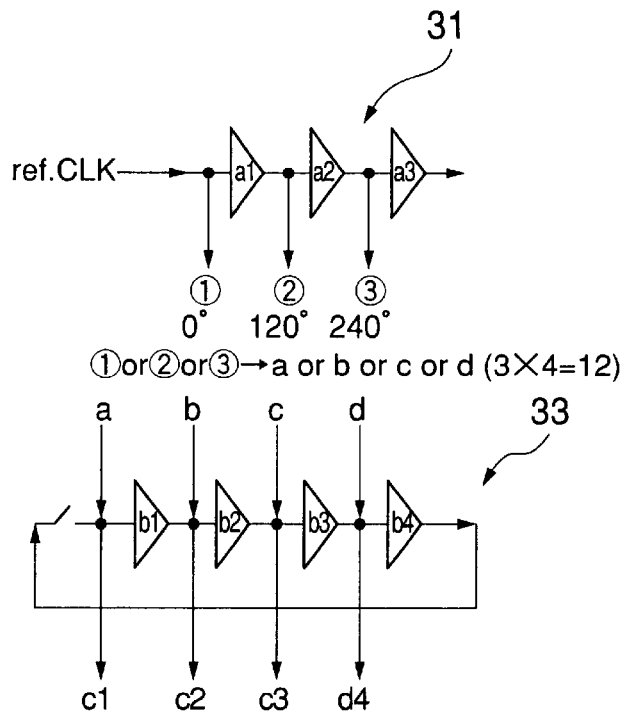
FIG. 7 is a circuit diagram of a digital phase control circuit according to a second embodiment of this invention.
FIG. 8 is a view for use in describing operation of the digital phase control circuit illustrated in FIG. 7.

Referring to FIGS. 7 and 8, the description will proceed to a digital phase control method and a digital phase control circuit according to a second embodiment of this invention. FIG. 7 is a circuit diagram of the digital phase control circuit according to the second embodiment of this invention. FIG. 8 is a view for use in describing operation of the digital phase control circuit illustrated in FIG. 7.

In the above-mentioned first embodiment, in order to generate the four second multi-phase clock signals c1 to c4, the delay buffer train 32 comprises the seven-stage secondary delay buffer, namely, the first through the seventh secondary delay buffers b1 to b7 which are chained with each other. In addition, in the above-mentioned first embodiment, wiring of the delay buffer train 32 is complicated to produce the four second multi-phase clock signals c1 to c4.

In the second embodiment, as shown in FIG. 7, a delay buffer train 33 comprises a four-stage secondary delay buffer, namely, the first through the fourth secondary delay buffers b1 to b4 which are chained with each other in a rig-shape fashion. Other structure is substantially similar to that illustrated in FIG. 4. With this structure, the number of the buffers and the wiring are reduced and a small scale of the circuit and reduction of consumed power are achieved.

In the similar manner in the above-mentioned first embodiment, the delay buffer train 33 has the first through the fourth input nodes a, b, c, and d which are supplied with the selected one of the first through the third primary delay output signals ①, ②, and ③ from the first delay line 31. The delay buffer train 33 is classified into first through fourth delay secondary buffer groups each of which comprises four successive secondary delay buffers having a first stage secondary delay buffer supplied with one of the first through the third primary delay output signals ①, ②, and ③.

More specifically, the first delay secondary buffer group consists of the first through the fourth secondary delay buffers b1 to b4 and has the first secondary delay buffer b1 as the first stage secondary delay buffer. The second delay secondary buffer group consists of the second, the third, the fourth, and the first secondary delay buffers b2, b3, b4, and b1 and has the second secondary delay buffer b2 as the first stage secondary delay buffer. The third delay secondary buffer group consists of the third, the fourth, the first, and the second secondary delay buffers b3, b4, b1, and b2 and has the third secondary delay buffer b3 as the first stage secondary delay buffer. The fourth delay secondary buffer group consists of the fourth, the first, the second, and the third secondary delay buffers b4, b1, b2, and b3 and has the fourth secondary delay buffer b4 as the first stage secondary delay buffer. One of the first through the fourth secondary buffer groups is feedback controlled by the second delay locked loop (not shown) so that the second total delay time is equal to one period of the reference clock signal ref.CLK.

In the delay buffer train 33, only one of the first through the fourth secondary buffer groups is activated or used as an active secondary buffer group or a second delay line which generates the four second multi-phase clock signals c1, c2, c3, and c4 having the second equal phase interval of 90° different from the first equal phase interval in the three first multi-phase clock signals ①, ②, and ③. The four second multi-phase clock signals c1 to c4 are called the first through the fourth secondary delay output signals, respectively.

Now, it will be assumed that the first input node a of the delay buffer train 33 is supplied with one of the first through the third primary delay output signals ①, ②, and ③. In this event, the clock signal is propagated in the order of the first secondary delay buffer b1 (the first stage)→the second secondary delay buffer b2→the third secondary delay buffer b3→the fourth secondary delay buffer b4 (a last stage) and propagation of the clock signal from the fourth secondary delay buffer b4 to the first secondary delay buffer b1 is cut off and is prevented. This case (state) is illustrated in FIG. 7. Simultaneously, the first secondary buffer group (b1→b2→b3→b4) is feedback controlled by the second delay locked loop (not shown).

Similarly, it will be assumed that the second input node b of the second delay line 33 is supplied with one of the first through the third primary delay output signals ①, ②, and ③. In this event, the clock signal is propagated in the order of the second secondary delay buffer b2 (the first stage)→the third secondary delay buffer b3→the fourth secondary delay buffer b4→the first secondary delay buffer b1 (the last stage) and propagation of the clock signal from the first secondary delay buffer b1 to the second secondary delay buffer b2 is cut off and is prevented. Simultaneously, the second secondary buffer group (b2→b3→b4→b1) is feedback controlled by the second delay locked loop (not shown).

It will be assumed that the third input node c of the delay buffer train 33 is supplied with one of the first through the third primary delay output signals ①, ②, and ③. In this event, the clock signal is propagated in the order of the third secondary delay buffer b3 (the first stage)→the fourth secondary delay buffer b4→the first secondary delay buffer b1→the second secondary delay buffer b2 (the last stage)

and propagation of the clock signal from the second secondary delay buffer b2 to the third secondary delay buffer b3 is cut off and is prevented. Simultaneously, the third secondary buffer group (b3→b4→b1→b2) is feedback controlled by the second delay locked loop (not shown).

It will be assumed that the fourth input node d of the delay buffer train 33 is supplied with one of the first through the third primary delay output signals ①, ②, and ③. In this event, the clock signal is propagated in the order of the fourth secondary delay buffer b4 (the first stage)→the first secondary delay buffer b1→the second secondary delay buffer b2→the third secondary delay buffer b3 (the last stage) and propagation of the clock signal from the third secondary delay buffer b3 to the fourth secondary delay buffer b4 is cut off and is prevented. Simultaneously, the fourth secondary buffer group (b4→b1→b2→b3) is feedback controlled by the second delay locked loop (not shown).

As a result, in the similar manner in the above-mentioned first embodiment, the delay buffer train 33 generates the four second multi-phase signals c1 to c4 having the second equal phase interval of 90° which is different from the first phase interval of the four first multi-phase clock signals ①, ②, and ③.

In the similar manner in the above-mentioned first embodiment, in the second embodiment, one of the first through the third primary delay output signals ①, ②, and ③ is selected as a selected primary delay output signal and the selected primary delay output signal is supplied to one of the first through the fourth input nodes a, b, c, and d of the delay buffer train 33. The phase of the four second multi-phase clock signals c1 to c4 is shifted by changing the combination of the three first multi-phase clock signals ①, ②, and ③ and the four second multi-phase clock signals c1 to c4 to be phase-locked. As shown in FIGS. 8 and 6, there is 3×4 or twelve synchronization states. It is possible to phase shift the four second multi-phase clock signals c1 to c4 at the resolution of 30° as a whole with the second phase interval of the four second multi-phase clock signals c1 to c4 maintained to keep 90°.

In the second embodiment of this invention, in general, the first delay line 31 may comprise M primary delay buffers which are chained with each other where M represents a first positive integer which is not less than two. The delay buffer train 33 may comprise N secondary delay buffers which are chained with each other in a ring-shaped fashion where N represents a second positive integer which is not less than two and which is different from the first positive integer M.

Figure 9:
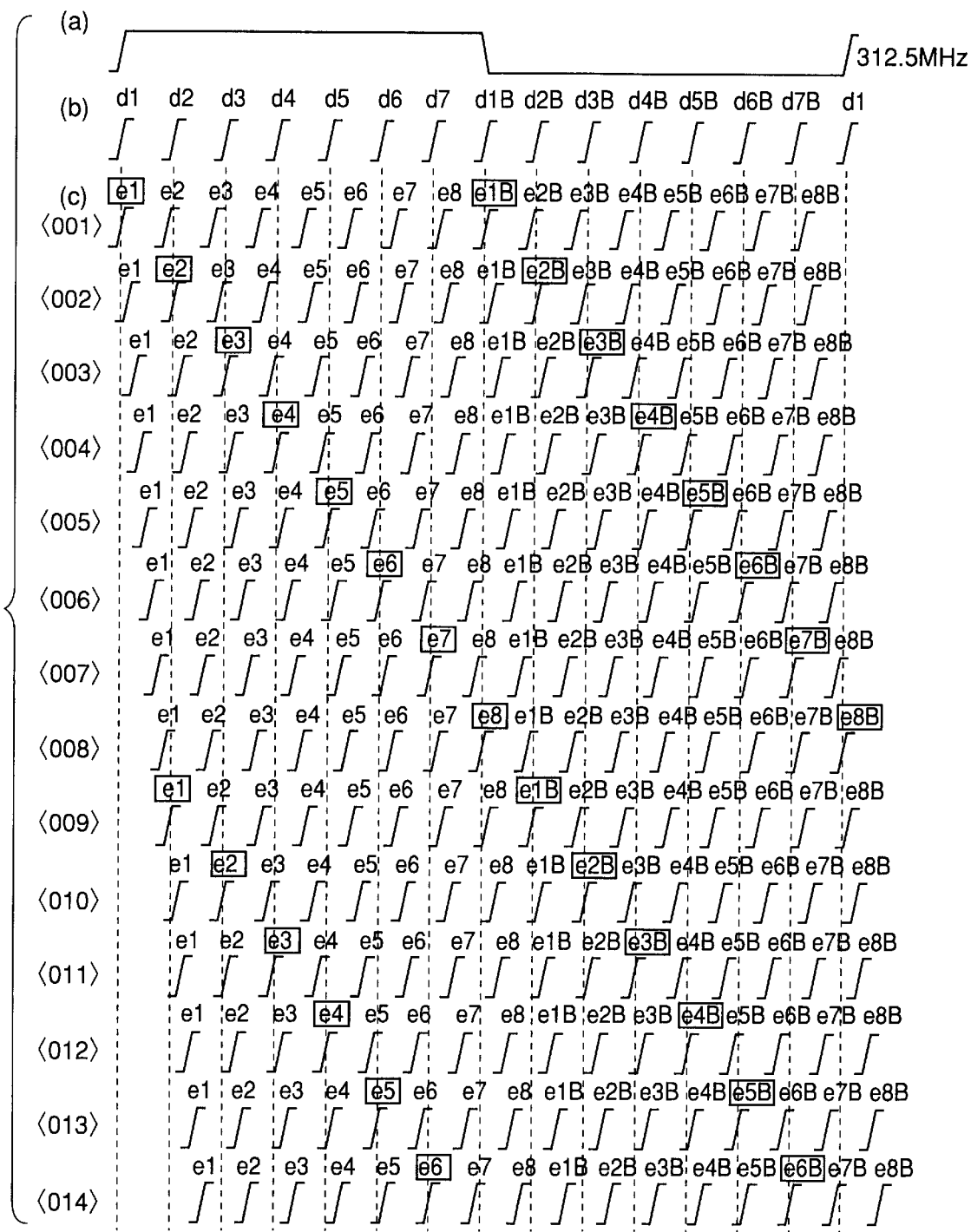
FIG. 9 is a time chart showing schematic waveforms indicative of position relationship of clock edges in a digital phase control method according to a third embodiment of this invention.

Referring to FIG. 9, the description will proceed to a digital phase control method according to a third embodiment of this invention. FIG. 9 is a timing chart showing schematic waveforms indicative of position relationship of clock edges in the third embodiment of this invention. In FIG. 9, a first or top line depicted at (a) shows a waveform of a reference clock signal having a reference clock frequency of 312.5 MHz, a second line depicted at (b) shows waveforms indicating leading edges of fourteen multi-phase clock signals, a third line depicted at (c) shows waveforms indicating leasing edges of sixteen multi-phase clock signals.

In the third embodiment of this invention, the description is made in a case where the reference clock signal having the reference clock frequency of 312.5 MHz (a reference clock period of 3200 ps) phase controls the multi-phase clock signals expanded in sixteen-phase at resolution of 28.6 ps.

FIG. 9(a) shows the waveform of the reference clock signal having the reference clock frequency of 312.5 MHz.

The digital phase control method according to the third embodiment uses fourteen first multi-phase clock signals d1, d2, d3, d4, d5, d6, d7, d1B, d2B, d3B, d4B, d5B, d6B, and d7B shown in FIG. 9(b) and sixteen second multi-phase clock signals e1, e2, e3, e4, e5, e6, e7, e8, e1B, e2B, e3B, e4B, e5B, e6B, e7B, and e8B shown in FIG. 9(c). The former ones d1 to d7 of the fourteen first multi-phase clock signals are called first through seventh primary delay output signals, respectively, while the latter ones d1B to d7B of the fourteen first multi-phase clock signals are called first through seventh inverted primary delay output signals, respectively. Likewise, the former ones e1 to e8 of the sixteen second multi-phase clock signals are referred as first through eighth secondary delay output signals, respectively, while the latter ones e1B to e8B of the sixteen second multi-phase clock signals are referred to as first through eighth inverted secondary delay output signals, respectively.

The fourteen first multi-phase clock signals d1–d7, d1B–d7B are obtained by expanding the reference clock signal having the reference clock frequency of 312.5 MHz shown in FIG. 9(a) into the fourteen-phase at a first equal phase interval. The sixteen second multi-phase clock signals e1–e8, e1B–e8B are obtained by expanding the reference clock signal having the reference clock frequency of 312.5 MHz shown in FIG. 9(a) into the sixteen-phase at a second equal phase interval. Accordingly, the first equal phase interval of the fourteen first multi-phase clock signals d1–d7, d1B–d7B is equal to 3200 ps/14≈228.6 ps while the second equal phase interval of the sixteen second multi-phase clock signals e1–e8, e1B–e8B is equal to 3200 ps/16= 200 ps. An m-th primary delay output signal dm and an m-th inverted primary delay output signal dmB have a relationship where a waveform is inverted with each other (a phase is shifted by half period to each other) and an n-th secondary delay output signal en and an n-th inverted secondary delay output signal enB have a relationship where a waveform is inverted with each other (a phase is shifted by half period to each other), where m represents a first variable between 1 and 7 both inclusive and n represents a second variable between 1 and 8 both inclusive.

By the analogy of the description of the above-mentioned first embodiment, it is possible for the digital phase control method according to the third embodiment of this invention to combine 14×16=224 synchronization states. However, inasmuch as fourteen or 14 and sixteen or 16 have a greatest common divisor (GCD) of two or 2, there is the same synchronization states two by two among the 224 synchronization states. Accordingly, different synchronization states are equal in number to 112.

Referring to FIG. 9, this will presently be described. Attention will be directed to a first synchronization state <001> between FIG. 9(b) and FIG. 9(c), namely, a state where the first primary delay output signal d1 and the first secondary delay output signal e1 are synchronized with each other. Delayed by half period (1600 ps), the first inverted primary delay output signal d1B and the first inverted secondary delay output signal e1B are also synchronized with each other. As described above, a synchronized clock edge is visible once in every half period. A combination of the first primary delay output signal d1 and the first secondary delay output signal e1 and another combination of the first inverted primary delay output signal d1B and the first inverted secondary delay output signal e1B have the same synchronization state.

According the third embodiment of this invention, the sixteen second multi-phase clock signals are phase controlled at resolution of 3200 ps/112≈28.6 ps by changing (14×16)/2=112 synchronization states by combining one of the fourteen first multi-phase clock signals d1–d7, d1B–d7B with one of the sixteen second multi-phase clock signals e1–e8, e1B–e8B except for repeated combinations. In other words, phase control is carried out by dividing the period of 3200 ps by 112 at the resolution of 28.6 ps. The resolution of 28.6 ps may be confirmed by a fact where the first phase interval of 228.6 ps of the fourteen first multi-phase clock signals subtracted by the second phase interval of 200 ps of the sixteen second multi-phase clock signal is 28.6 ps.

By the analogy of the description of the above-mentioned first embodiment of this invention, it is possible for the digital phase control method according the third embodiment of this invention to successively phase shift the sixteen second multi-phase clock signals e1–e8, e1B–e8B 28.6 ps by 28.6 ps by changing the above-mentioned combination for the clock signals to be phase-locked at a first cycle of d1→d2→d3→d4→d5→d6→d7→d1B→d2B→d3B→d3B→d5B→d6B→d7B as regards the fourteen first multi-phase clock signal and at a second cycle of e1→e2→e3→e4→e5→e6→e7→e8→e1B→e2B→e3B→e4B→e5B→e6B→e7B→e8B as regards the sixteen second multi-phase clock signals. The 112 synchronization states obtained by combining the first cycle with the second cycle will be described with symbols or number <001> to <112>. A list of combination of the symbols (number) for the synchronization states and the clock signals is illustrated in Table 1 as follows.

TABLE 1

| A | B | C | D | E | F(C–E) | G |
|---|---|---|---|---|---|---|
| <001> | d1 | 0.0 | e1 | 0.0 | 0.0 | off |
| <002> | d2 | 228.6 | e2 | 200.0 | 28.6 | off |
| <003> | d3 | 457.2 | e3 | 400.0 | 57.2 | off |
| <004> | d4 | 685.8 | e4 | 600.0 | 85.8 | off |
| <005> | d5 | 914.4 | e5 | 800.0 | 114.4 | off |
| <006> | d6 | 1143.0 | e6 | 1000.0 | 143.0 | off |
| <007> | d7 | 1371.6 | e7 | 1200.0 | 171.6 | off |
| <008> | d1B | 1600.2 | e8 | 1400.0 | 200.2 | off |
| <009> | d2B | 1828.8 | e1B | 1600.0 | 228.8 | on |
| <010> | d3B | 2057.4 | e2B | 1800.0 | 257.4 | on |
| <011> | d4B | 2286.0 | e3B | 2000.0 | 286.0 | on |
| <012> | d5B | 2514.6 | e4B | 2200.0 | 314.6 | on |
| <013> | d6B | 2743.2 | e5B | 2400.0 | 343.2 | on |
| <014> | d7B | 2971.8 | e6B | 2600.0 | 371.8 | on |
| <015> | d1 | 0.0 | e7B | 2800.0 | 400.0 | on |
| <016> | d2 | 228.6 | e8B | 3000.0 | 428.6 | on |
| <017> | d3 | 457.2 | e1 | 0.0 | 457.2 | off |
| <018> | d4 | 685.8 | e2 | 200.0 | 485.8 | off |
| <019> | d5 | 914.4 | e3 | 400.0 | 514.4 | off |
| <020> | d6 | 1143.0 | e4 | 600.0 | 543.0 | off |
| <021> | d7 | 1371.6 | e5 | 800.0 | 571.6 | off |
| <022> | d1B | 1600.2 | e6 | 1000.0 | 600.2 | off |
| <023> | d2B | 1828.8 | e7 | 1200.0 | 628.8 | off |
| <024> | d3B | 2057.4 | e8 | 1400.0 | 657.4 | off |
| <025> | d4B | 2286.0 | e1B | 1600.0 | 686.0 | on |
| <026> | d5B | 2514.6 | e2B | 1800.0 | 714.6 | on |
| <027> | d6B | 2743.2 | e3B | 2000.0 | 743.2 | on |
| <028> | d7B | 2971.8 | e4B | 2200.0 | 771.8 | on |
| <029> | d1 | 0.0 | e5B | 2400.0 | 800.0 | on |
| <030> | d2 | 228.6 | e6B | 2600.0 | 828.6 | on |
| <031> | d3 | 457.2 | e7B | 2800.0 | 857.2 | on |
| <032> | d4 | 685.8 | e8B | 3000.0 | 885.8 | on |
| <033> | d5 | 914.4 | e1 | 0.0 | 914.4 | off |
| <034> | d6 | 1143.0 | e2 | 200.0 | 943.0 | off |
| <035> | d7 | 1371.6 | e3 | 400.0 | 971.6 | off |
| <036> | d1B | 1600.2 | e4 | 600.0 | 1000.2 | off |
| <037> | d2B | 1828.8 | e5 | 800.0 | 1028.8 | off |
| <038> | d3B | 2057.4 | e6 | 1000.0 | 1057.4 | off |
| <039> | d4B | 2286.0 | e7 | 1200.0 | 1086.0 | off |
| <040> | d5B | 2514.6 | e8 | 1400.0 | 1114.6 | off |
| <041> | d6B | 2743.2 | e1B | 1600.0 | 1143.2 | on |
| <042> | d7B | 2971.8 | e2B | 1800.0 | 1171.8 | on |
| <043> | d1 | 0.0 | e3B | 2000.0 | 1200.0 | on |
| <044> | d2 | 228.6 | e4B | 2200.0 | 1228.6 | on |
| <045> | d3 | 457.2 | e5B | 2400.0 | 1257.2 | on |
| <046> | d4 | 685.8 | e6B | 2600.0 | 1285.8 | on |
| <047> | d5 | 914.4 | e7B | 2800.0 | 1314.4 | on |
| <048> | d6 | 1143.0 | e8B | 3000.0 | 1343.0 | on |
| <049> | d7 | 1371.6 | e1 | 0.0 | 1371.6 | off |
| <050> | d1B | 1600.2 | e2 | 200.0 | 1400.2 | off |
| <051> | d2B | 1828.8 | e3 | 400.0 | 1428.8 | off |
| <052> | d3B | 2057.4 | e4 | 600.0 | 1457.4 | off |
| <053> | d4B | 2286.0 | e5 | 800.0 | 1486.0 | off |
| <054> | d5B | 2514.6 | e6 | 1000.0 | 1514.6 | off |
| <055> | d6B | 2743.2 | e7 | 1200.0 | 1543.2 | off |
| <056> | d7B | 2971.8 | e8 | 1400.0 | 1571.8 | off |
| <057> | d1 | 0.0 | e1B | 1600.0 | 1600.0 | on |
| <058> | d2 | 228.6 | e2B | 1800.0 | 1628.6 | on |
| <059> | d3 | 457.2 | e3B | 2000.0 | 1657.2 | on |
| <060> | d4 | 685.8 | e4B | 2200.0 | 1685.8 | on |
| <061> | d5 | 914.4 | e5B | 2400.0 | 1714.4 | on |
| <062> | d6 | 1143.0 | e6B | 2600.0 | 1743.0 | on |
| <063> | d7 | 1371.6 | e7B | 2800.0 | 1771.6 | on |
| <064> | d1B | 1600.2 | e8B | 3000.0 | 1800.2 | on |
| <065> | d2B | 1828.8 | e1 | 0.0 | 1828.8 | off |
| <066> | d3B | 2057.4 | e2 | 200.0 | 1857.4 | off |
| <067> | d4B | 2286.0 | e3 | 400.0 | 1886.0 | off |
| <068> | d5B | 2514.6 | e4 | 600.0 | 1914.6 | off |
| <069> | d6B | 2743.2 | e5 | 800.0 | 1943.2 | off |
| <070> | d7B | 2971.8 | e6 | 1000.0 | 1971.8 | off |
| <071> | d1 | 0.0 | e7 | 1200.0 | 2000.0 | off |
| <072> | d2 | 228.6 | e8 | 1400.0 | 2028.6 | off |
| <073> | d3 | 457.2 | e1B | 1600.0 | 2057.2 | on |
| <074> | d4 | 685.8 | e2B | 1800.0 | 2085.8 | on |
| <075> | d5 | 914.4 | e3B | 2000.0 | 2114.4 | on |
| <076> | d6 | 1143.0 | e4B | 2200.0 | 2143.0 | on |
| <077> | d7 | 1371.6 | e5B | 2400.0 | 2171.6 | on |
| <078> | d1B | 1600.2 | e6B | 2600.0 | 2200.2 | on |
| <079> | d2B | 1828.8 | e7B | 2800.0 | 2228.8 | on |
| <080> | d3B | 2057.4 | e8B | 3000.0 | 2257.4 | on |
| <081> | d4B | 2286.0 | e1 | 0.0 | 2286.0 | off |
| <082> | d5B | 2514.6 | e2 | 200.0 | 2314.6 | off |
| <083> | d6B | 2743.2 | e3 | 400.0 | 2343.2 | off |
| <084> | d7B | 2971.8 | e4 | 600.0 | 2371.8 | off |
| <085> | d1 | 0.0 | e5 | 800.0 | 2400.0 | off |
| <086> | d2 | 228.6 | e6 | 1000.0 | 2428.6 | off |
| <087> | d3 | 457.2 | e7 | 1200.0 | 2457.2 | off |
| <088> | d4 | 685.8 | e8 | 1400.0 | 2485.8 | off |
| <089> | d5 | 914.4 | e1B | 1600.0 | 2514.4 | on |
| <090> | d6 | 1143.0 | e2B | 1800.0 | 2543.0 | on |
| <091> | d7 | 1371.6 | e3B | 2000.0 | 2571.6 | on |
| <092> | d1B | 1600.2 | e4B | 2200.0 | 2600.2 | on |
| <093> | d28 | 1828.8 | e5B | 2400.0 | 2628.8 | on |
| <094> | d3B | 2057.4 | e6B | 2600.0 | 2657.4 | on |
| <095> | d4B | 2286.0 | e7B | 2800.0 | 2686.0 | on |
| <096> | d5B | 2514.6 | e8B | 3000.0 | 2714.6 | on |
| <097> | d6B | 2743.2 | e1 | 0.0 | 2743.2 | off |
| <098> | d7B | 2971.8 | e2 | 200.0 | 2771.8 | off |
| <099> | d1 | 0.0 | e3 | 400.0 | 2800.0 | off |
| <100> | d2 | 228.6 | e4 | 600.0 | 2828.6 | off |
| <101> | d3 | 457.2 | e5 | 800.0 | 2857.2 | off |
| <102> | d4 | 685.8 | e6 | 1000.0 | 2885.8 | off |
| <103> | d5 | 914.4 | e7 | 1200.0 | 2914.4 | off |
| <104> | d6 | 1143.0 | e8 | 1400.0 | 2943.0 | off |
| <105> | d7 | 1371.6 | e1B | 1600.0 | 2971.6 | on |
| <106> | d1B | 1600.2 | e2B | 1800.0 | 3000.2 | on |
| <107> | d2B | 1828.8 | e3B | 2000.0 | 3028.8 | on |
| <108> | d3B | 2057.4 | e4B | 2200.0 | 3057.4 | on |
| <109> | d4B | 2286.0 | e5B | 2400.0 | 3086.0 | on |
| <110> | d5B | 2514.6 | e6B | 2600.0 | 3114.6 | on |
| <111> | d6B | 2743.2 | e7B | 2800.0 | 3143.2 | on |
| <112> | d7B | 2971.8 | e8B | 3000.0 | 3171.8 | on |

In Table 1, an item A represents the number of the synchronization state, an item B represents one of the fourteen first multi-phase clock signals d1–d7, d1B–d7B, an item C represents a phase of one of the fourteen first multi-phase clock signals, an item D represents a reference symbol of the clock signal to be synchronized in the sixteen second multi-phase clock signals e1–e8, e1B–e8B, an item E represent a phase difference between the clock signal in question and the clock signal e1, and an item F represents a phase of the clock signal e1.

In the items B and C in the Table 1, a combination of the m-th primary delay output signal dm and the n-th secondary delay output signal en is identical with a combination of the m-th inverted primary delay output signal dmB and the n-th inverted secondary delay output signal enB, a combination of the m-th inverted primary delay output signal dmB and the n-th secondary delay output signal en is identical with the m-th primary delay output signal dB and the n-th inverted secondary delay output signal enB, and a combination of the m-th primary delay output signal dm and the n-th inverted secondary delay output signal enB is identical with a combination of the m-th inverted primary delay output signal and the n-th secondary delay output signal en. This is because, in the manner which is described above, these combinations are combinations related to simultaneously synchronize. In the description which will be presently made, one of two combinations simultaneously synchronized will be described and description of another is omitted.

It will be assumed that the reference clock signal is the first primary delay output signal d1.

Now, examination is made about the phase of the sixteen second multi-phase clock signals e1–e8, e1B–e8B in each synchronization state. Inasmuch as the sixteen second multi-phase clock signals e1–e8, e1B–e8B have the second phase interval of 200 ps, the phase of the first secondary delay output signal e1 will be checked on behalf of the sixteen second multi-phase clock signals e1–e8, e1B–e8B. When the phase of the first secondary delay output signal e1 is specified or fixed as a specified phase, the second through the eighth secondary delay output signals e2–e8 and the first through the eighth inverted secondary delay output signals e1B–e8B have phases obtained by successively adding 200 ps by 200 ps to the specified phase in this order.

The fourteen first multi-phase clock signals d1–d7, d1B–d7B have the first phase interval of 228.6 ps and have fixed phases. It will be assumed the first primary delay output signal d1 has a reference phase of 0 ps. In this event, as illustrated in Table 1, the fourteen first multi-phase clock signals d1–d7, d1B–d7B have phases in this order as follows: d1: 0 ps, d2: 228.6 ps, d3: 457.2 ps, d4: 685.8 ps, d5: 914.4 ps, d6: 1143.0 ps, d7: 1371.6 ps, d1B: 1600.2 ps, d2B: 1828.8 ps, d3B: 2057.4 ps, d4B: 2286.0 ps, d5B: 2514.6 ps, d6B: 2743.2 ps, and d7B: 971.8 ps.

In the first synchronization state <001>, inasmuch as the first primary delay output signal d1 and the first secondary delay output signal e1 are phase-locked with each other, the first secondary delay output signal e1 has the specified phase equal to 0 ps. In a second synchronization state <002>, inasmuch as the second primary delay output signal d2 and the second secondary delay output signal e2 are phase-locked with each other, the first secondary delay output signal e1 has the specified phase equal to 28.6 ps obtained by subtracting a phase difference of 200 ps between the second secondary delay output signal e2 and the first secondary delay output signal e1 from a phase of 228.6 ps of the second primary delay output signal d2. In similar manner, the specified phase of the first secondary delay output signal e1 in third through one hundred and twelfth synchronization states <003> to <112> are calculated. In addition, in the fifteenth synchronization state <015>, inasmuch as the first primary delay output signal d1 and the seventh inverted secondary delay output signal e7B are phase-locked with each other, the first secondary delay output signal e1 has the specified phase equal to −2800 ps obtained by subtracting a phase difference of 2800 ps between the seventh inverted secondary delay output signal e7B and the first secondary delay output signal e1 from a phase of 0 of the first primary delay output signal d1. In such a case where the specified phase has a value beyond a range of numerical values of one period, in terms of the range (0≦x<3200) of numerical values of one period, the specified phase of the first secondary delay output signal e1 is equal to 400 ps. In the manner which is understood by referring to Table 1, the first secondary delay output signal e1 is phase shifted at the resolution of 28.6 ps. This means that the sixteen second multi-phase clock signals e1–e8, e1B–e8B are phase shifted at the resolution of 28.6 ps with the second equal phase interval maintained to keep 200 ps.

By successively changing the synchronization state in the forward direction of <001>→ . . . →112>→<001>→ . . . , it is possible to delay the phases of the sixteen second multi-phase clock signals e1–e8, e1B–e8B at the resolution of 28.6 ps. Conversely, by successively changing the synchronization state in the reverse direction of <001>→<112>→ . . . <001>→, it is possible to advance the phases of the sixteen second multi-phase clock signals e1–e8, e1B–e8B at the resolution of 28.6 ps.

FIG. 9(c) illustrates the first through the fourteenth synchronization states <001> to <014>. In each synchronization state of FIG. 9(c), symbols of the phase-locked clock signals are set in a frame. Referring to Table 1, a case of the second synchronization state <002> is a combination of the clock signals in which the second primary delay output signal d2 and the second secondary delay output signal e2 are phase-locked with each other. Referring to FIG. 9, the leading edge of the second primary delay output signal d2 and the leading edge of the second secondary delay output signal e2 have the same phase. In this event, the phase of the third secondary delay output signal e3 advances from the phase of the third primary delay output signal d3 by 28.6 ps. Accordingly, by synchronizing the third primary delay output signal d2 with the third secondary delay output signal e3 (making the third synchronization state <003>), it is possible to delay the phases of the sixteen second multi-phase signals e1–e8, e1B–e8B by 28.6 ps in regard to the second synchronization state <002>.

In addition, referring to FIG. 9, in a case of the second synchronization state <002>, the phase of the first secondary delay output signal e1 delays from the phase of the first primary delay output signal d1 by 28.6 ps. Accordingly, by synchronizing the first primary delay output signal d1 with the first secondary delay output signal e1 (making the first synchronization state <001>), it is possible to advance the phases of the sixteen second multi-phase signals e1–e8, e1B–e8B by 28.6 ps in regard to the second synchronization state <002>.

In regard to other all of the synchronization states, the principle of the phase shift in the manner as described above is realized.

In the manner which is described above, according to the digital phase control method according to the third embodiment of this invention, it is possible to infinitely (cyclically) phase shift (phase control) the sixteen multi-phase clock signals at the resolution of 28.6 ps as a whole with the second phase interval maintained to keep 200 ps both in an advance or lead direction and in a delay or lag direction.

Figure 10:
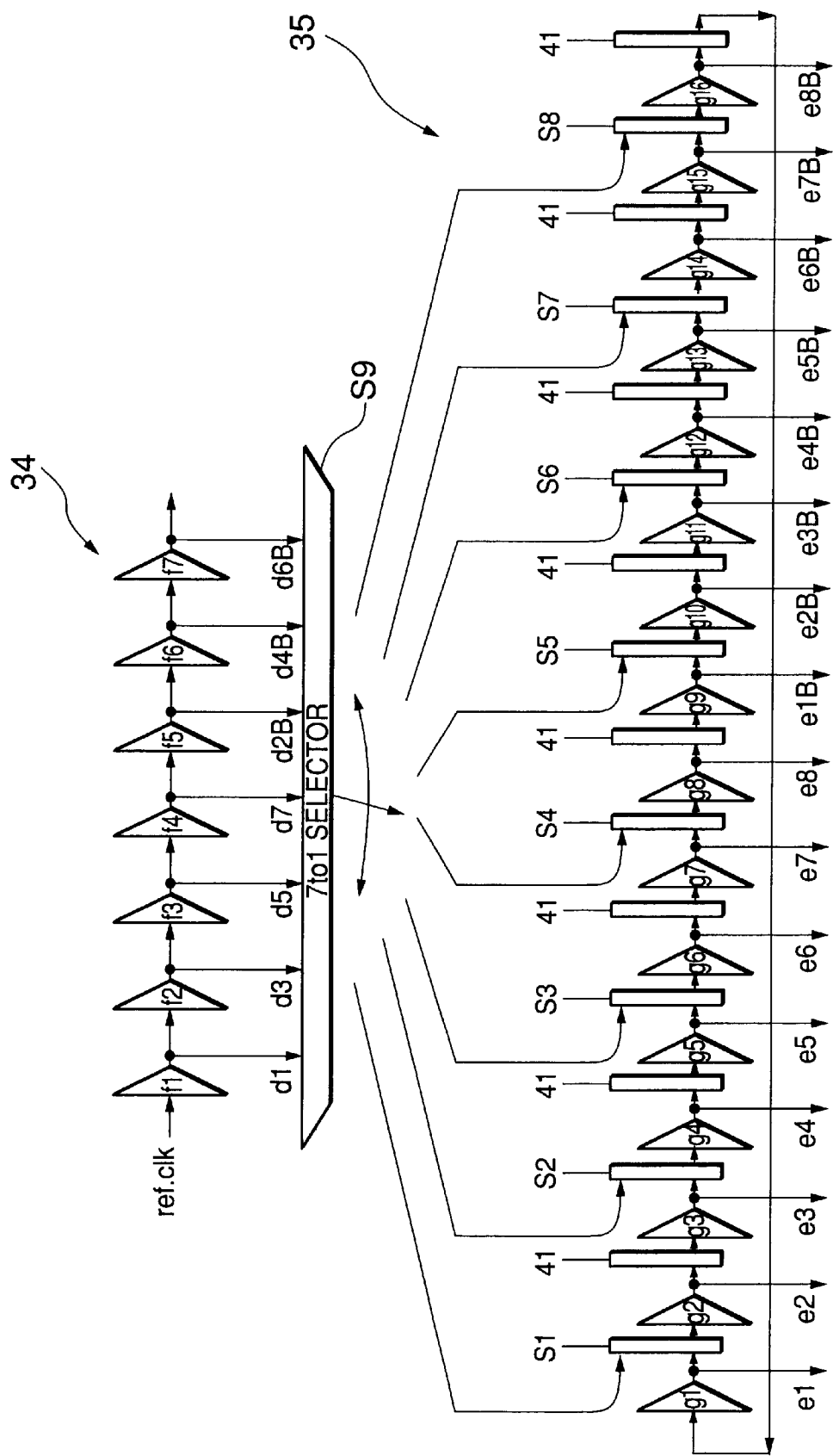
FIG. 10 is a schematic block diagram of a digital phase control circuit according to a fourth embodiment of this invention.

Referring to FIG. 10, the description will proceed to a digital phase control circuit according to a fourth embodiment of this invention. FIG. 10 is a schematic block diagram of the digital phase control circuit according to the fourth embodiment of this invention. The illustrated digital phase control circuit is for realizing the digital phase control method according to the third embodiment of this invention.

The fourth embodiment is an embodiment in a case of phase controlling sixteen multi-phase clock signals at resolution of 3200 ps/56 ≈57 ps by changing 7×8=56 synchronization states using a combination of one of seven first multi-phase clock signals and one of eight second multi-phase clock signals by a single-phase circuitry configuration. By using seven first multi-phase clock signals and sixteen second multi-phase clock signals, it is possible to phase control by dividing a period of 3200 ps by 112 at 28.6 ps. However, the fourth embodiment shows a case of phase controlling the sixteen second multi-phase clock signals at the resolution of 57 ps by selecting a clock signal to be phase-locked from the sixteen second multi-phase clock signals every two clock signals without using minimum resolution. This is because it may be enough at resolution of about 57 ps on phase controlling the sixteen second multi-phase clock signals in dependency on a use utilizing a method of this invention.

As shown in FIG. 10, the digital phase control circuit according to the fourth embodiment of this invention comprises a first delay line 34, a delay buffer train 35, a first selection circuit S9, and a second selection section comprising first through eighth secondary selection circuits S1, S2, S3, S4, S5, S6, S7, and S8. The first delay line 34 comprises a seven-stage single-phase delay buffer or first through seventh primary delay buffers f1, f2, f3, f4, f6, f6, and f7 which are chained with each other. The first delay line 34 is feedback controlled by a first delay locked loop (not shown). The delay buffer train 35 comprises a sixteen-stage single-phase delay buffer or first through sixteenth secondary delay buffers g1, g2, g3, g4, g5, g6, g7, g8, g9, g10, g11, g12, g13, g14, g15, and g16 which are chained with each other in a ring-shaped fashion. The first selection circuit S9 selects one of the first through the seventh primary delay buffers f1 to f7 to fetch a selected clock signal. The second selection circuit is for selecting one of the first, the third, the fifth, the seventh, the ninth, the eleventh, the thirteenth, and the fifteenth secondary delay buffers g1, g3, g5, g7, g9, g11, g13, and g15 in the delay buffer train 35 to supply with the selected clock signal.

In the second selection circuit, the first through the eighth secondary selection circuits S1 to S8 are disposed between the first and the second secondary delay buffers g1 and g2, between the third and the fourth secondary delay buffers g3 and g4, between the fifth and the sixth secondary delay buffers g5 and g6, between the seventh and the eighth secondary delay buffers g7 and g8, between the ninth and the tenth secondary delay buffers g9 and g10, between the eleventh and the twelfth secondary delay buffers g11 and g12, between the thirteenth and the fourteenth secondary delay buffers g13 and g14, and between the fifteenth and the sixteenth secondary delay buffers g15 and g16 in this order. Inasmuch as each of the first through the eighth secondary selection circuits S1 to S8 has a minute delay, eight dummy circuits 41 each having equivalent delay characteristic are disposed between the second and the third secondary delay buffers g2 and g3, between the fourth and the fifth secondary delay buffers g4 and g5, between the sixth and the seventh secondary delay buffers g6 and g7, between the eighth and the ninth secondary delay buffers g8 and g9, between the tenth and the eleventh secondary delay buffers g10 and g11, between the twelfth and the thirteenth secondary delay buffers g12 and g13, between the fourteenth and the fifteenth secondary delay buffers g14 and g15, and between the sixteenth and first secondary delay buffers g16 and g1. With this structure, it is possible to generate more equally multi-phase clock signals.

Produced by the first delay line 34, seven first multi-phase clock signals are attached with similar reference symbols of those in the first multi-phase clock signals d1–d7, d1B–d7B in the above-mentioned third embodiment that have corresponding phases. That is, the first delay line 34 produces the seven first multi-phase clock signals, namely, the first primary delay output signal d1, the third primary delay output signal d3, the fifth primary delay output signal d5, the seventh primary delay output signal d7, the second inverted primary delay output signal d2B, the fourth inverted primary delay output signal d4B, and the sixth inverted primary delay output signal d6B.

In addition, produced by the delay buffer train 35, sixteen second multi-phase clock signals are attached with similar reference symbols of the sixteen second multi-phase clock signals e1–e8, e1B–e8B in the above-mentioned third embodiment because the sixteen second multi-phase clock signals in question correspond to the sixteen second multi-phase clock signals in the third embodiment. That is, the delay buffer train 35 produces the sixteen second multi-phase clock signals e1–e8, e1B–e8B.

In the fourth embodiment of this invention, only the synchronization states <001>, <003>, <005>, . . . , and <111> having odd numbers in Table 1 are used. A list of each synchronization state in the fourth embodiment is illustrated in Table 2 as follows.

TABLE 2

| A | B | C | D | E | F(C–E) | S(x) |
|---|---|---|---|---|---|---|
| <001> | d1 | 0.0 | e1 | 0.0 | 0.0 | S1 |
| <003> | d3 | 457.2 | e3 | 400.0 | 57.2 | S2 |
| <005> | d5 | 914.4 | e5 | 800.0 | 114.4 | S3 |
| <007> | d7 | 1371.6 | e7 | 1200.0 | 171.6 | S4 |
| <009> | d2B | 1828.8 | e1B | 1600.0 | 228.8 | S5 |
| <011> | d4B | 2286.0 | e3B | 2000.0 | 286.0 | S6 |
| <013> | d6B | 2743.2 | e5B | 2400.0 | 343.2 | S7 |
| <015> | d1 | 0.0 | e7B | 2800.0 | 400.0 | S8 |
| <017> | d3 | 457.2 | e1 | 0.0 | 457.2 | S1 |
| <019> | d5 | 914.4 | e3 | 400.0 | 514.4 | S2 |
| <021> | d7 | 1371.6 | e5 | 800.0 | 571.6 | S3 |
| <023> | d2B | 1828.8 | e7 | 1200.0 | 628.8 | S4 |
| <025> | d4B | 2286.0 | e1B | 1600.0 | 686.0 | S5 |
| <027> | d6B | 2743.2 | e3B | 2000.0 | 743.2 | S6 |
| <029> | d1 | 0.0 | e5B | 2400.0 | 800.0 | S7 |
| <031> | d3 | 457.2 | e7B | 2800.0 | 857.2 | S8 |
| <033> | d5 | 914.4 | e1 | 0.0 | 914.4 | S1 |
| <035> | d7 | 1371.6 | e3 | 400.0 | 971.6 | S2 |
| <037> | d2B | 1828.8 | e5 | 800.0 | 1028.8 | S3 |
| <039> | d4B | 2286.0 | e7 | 1200.0 | 1086.0 | S4 |
| <041> | d6B | 2743.2 | e1B | 1600.0 | 1143.2 | S5 |
| <043> | d1 | 0.0 | e3B | 2000.0 | 1200.0 | S6 |
| <045> | d3 | 457.2 | e5B | 2400.0 | 1257.2 | S7 |
| <047> | d5 | 914.4 | e7B | 2800.0 | 1314.4 | S8 |
| <049> | d7 | 1371.6 | e1 | 0.0 | 1371.6 | S1 |
| <051> | d2B | 1828.8 | eB | 400.0 | 1428.8 | S2 |
| <053> | d4B | 2286.0 | e5 | 800.0 | 1486.0 | S3 |
| <055> | d6B | 2743.2 | e7 | 1200.0 | 1543.2 | S4 |
| <057> | d1 | 0.0 | e1B | 1600.0 | 1600.0 | S5 |
| <059> | d3 | 457.2 | e3B | 2000.0 | 1657.2 | S6 |
| <061> | d5 | 914.4 | e5B | 2400.0 | 1714.4 | S7 |
| <063> | d7 | 1371.6 | e7B | 2800.0 | 1771.6 | S8 |
| <065> | d2B | 1828.8 | e1 | 0.0 | 1828.8 | S1 |
| <067> | d4B | 2286.0 | e3 | 400.0 | 1886.0 | S2 |
| <069 > | d6B | 2743.2 | e5 | 800.0 | 1943.2 | S3 |
| <071> | d1 | 0.0 | e7 | 1200.0 | 2000.0 | S4 |
| <073> | d3 | 457.2 | e1B | 1600.0 | 2057.2 | S5 |
| <075> | d5 | 914.4 | e3B | 2000.0 | 2114.4 | S6 |
| <077> | d7 | 1371.6 | e5B | 2400.0 | 2171.6 | S7 |

TABLE 2-continued

| A | B | C | D | E | F(C-E) | S(x) |
|---|---|---|---|---|---|---|
| <079> | d2B | 1828.8 | e7B | 2800.0 | 2228.8 | S8 |
| <081> | d4B | 2286.0 | e1 | 0.0 | 2286.0 | S1 |
| <083> | d6B | 2743.2 | e3 | 400.0 | 2343.2 | S2 |
| <085> | d1 | 0.0 | e5 | 800.0 | 2400.0 | S3 |
| <087> | d3 | 457.2 | e7 | 1200.0 | 2457.2 | S4 |
| <089> | d5 | 914.4 | e1B | 1600.0 | 2514.4 | S5 |
| <091> | d7 | 1371.6 | e3B | 2000.0 | 2571.6 | S6 |
| <093> | d2B | 1828.8 | e5B | 2400.0 | 2628.8 | S7 |
| <095> | d4B | 2286.0 | e7B | 2800.0 | 2680.0 | S8 |
| <097> | d6B | 2743.2 | e1 | 0.0 | 2743.2 | S1 |
| <099> | d1 | 0.0 | e3 | 400.0 | 2800.0 | S2 |
| <101> | d3 | 457.2 | e5 | 800.0 | 2857.2 | S3 |
| <103> | d5 | 914.4 | e7 | 1200.0 | 2914.4 | S4 |
| <105> | d7 | 1371.6 | e1B | 1600.0 | 2971.0 | S5 |
| <107> | d2B | 1828.8 | e3B | 2000.0 | 3028.8 | S6 |
| <109> | d4B | 2286.0 | e5B | 2400.0 | 3086.0 | S7 |
| <111> | d6B | 2743.2 | e7B | 2800.0 | 3143.2 | S8 |

The items A to F in Table 2 are identical to those where only the synchronization states having the odd numbers of Table 1 are extracted. An item S(x) represents a reference number of the selection circuit which is put into an on state among the first through the eighth secondary selection circuits S1 to S8. When one of the first through the eighth secondary selection circuits S1 to S8 is put into the on state, remaining seven secondary selection circuits are put into an off state. That is, there is no two or more selection circuits which are simultaneously put into the on state among the first through the eighth secondary selection circuits S1 to S8. The secondary selection circuits put into the off state among the first through the eighth secondary selection circuits S1 to S8 are omitted from Table 2.

A reference clock signal ref.clk is a single-phase signal and is generated and supplied from an external phase-locked loop (PLL) or the like.

The first delay locked loop (not shown) comprises a first phase-frequency comparator, a first charge pump, a first low pass filter, and so on. The first delay locked loop detects a first phase difference by phase comparing an input clock signal (or the reference clock signal ref.clk) supplied to the first primary delay buffer f1 with an output clock signal (or the sixth inverted primary delay output signal d6B). In addition, the first delay locked loop generates a first control voltage on the basis of the first phase difference and supplies the first control voltage to the first through the seventh primary buffers f1 to f7 to feedback control the first delay line 34 so that the first delay line 34 has a first total delay equal to one period of 3200 ps of the reference clock signal ref.clk. With this structure, each of the first through the seventh primary delay buffers f1 to f7 has a first propagation delay to keep equal to (3200/7)ps and the seven first multi-phase clock signals d1, d3, d5, d7, d2B, d4B, and d6B have a first phase interval to keep equal to (3200/7)ps.

A selection of the seven first multi-phase clock signals d1, d3, d5, d7, d2B, d4B, and d6B in the item B is carried out by the first selection circuit S9.

When the first secondary selection circuit S1 is turned on, the selected single-phase clock signal selected by the first selection circuit S9 is supplied to the second secondary delay buffer g2 and propagation of the clock signal from the first secondary delay buffer g1 to the second secondary delay buffer g1 is cut off. In this event, the second through the eighth secondary selection circuits S2 to S8 are turned off so that input/output of the clock signal is not carried out. Simultaneously on changing of the first through the eighth secondary selection circuits S1 to S8, a second delay locked loop (not shown) feedback controls the delay buffer train 35 so that a sixteen-stage second delay line having the second secondary delay buffer g2 as the first-state delay buffer and having the first secondary delay buffer g1 as the last-stage delay buffer has a second total delay (including delays in the first through the eighth secondary selection circuits S1 to S8 and the eight dummy circuits 41) equal to one period of 3200 ps of the reference clock signal ref.clk. Inasmuch as each of the first through the eighth secondary selection circuits S1 to S8 and the eight dummy circuits 41 has a minute propagation delay, strictly speaking, the delay buffer train 35 comprises the first through the eighth secondary selection circuits S1 to S8, the eight dummy circuits 41, and the first through the sixteenth secondary delay buffers g1 to g16. The second delay locked loop (not shown) controls the second delay line by phase comparing an input clock signal supplied to the first secondary selection circuit S1 with an output clock signal produced by the first secondary delay buffer g1. By feedback control of the second delay locked loop, each of the first through the sixteenth secondary delay buffers g1 to g7 has a second propagation delay to keep equal to (3200/16)ps and the sixteen second multi-phase clock signals e1–e8, e1B–e8B have a second phase interval to keep equal to (3200/16)ps.

Operations of the second through the eighth secondary selection circuits S2 to S8 and the second delay locked loop accompanied with this are also similar. As described above, the first through the eighth secondary selection circuits S1 to S8 serve as arrangements for cutting propagation of the clock signal in the delay buffer train 35 off.

For example, in the first synchronization state <001>, the first primary delay output signal d1 is selected by the first selection circuit S9 as the selected clock signal, the first secondary selection circuit S1 is turned on to supply the first primary delay output signal d1 to the second secondary delay buffer g2, and propagation of the clock signal from the first secondary delay buffer g1 to the second secondary delay buffer g2 is cut off. Therefore, the first primary delay output signal d1 and the first secondary delay output signal e1 are phase locked with each other. However, inasmuch as the first selection circuit S9 lies between the first primary delay output signal d1 and the first secondary delay output signal e1 on drawing, strictly speaking, the first primary delay output signal d1 and the first secondary delay output signal e1 have a phase difference therebetween that corresponds to a delay of the first selection circuit S9. Under the circumstances, referring to Table 2, the first secondary delay output signal e1 has the specified phase of 0 ps. In the first synchronization state <001>, the second delay locked loop (not shown) feedback controls the delay buffer train 35 so that so that the sixteen-stage second delay line having the second secondary delay buffer g2 as the first-state delay buffer and having the first secondary delay buffer g1 as the last-stage delay buffer has the second total delay (including delays in the first through the eighth secondary selection circuits S1 to S8 and the eight dummy circuits 41) equal to one period of 3200 ps of the reference clock signal ref.clk.

In addition, for example, in the eighty-seventh synchronization state <087>, the third primary delay output signal d3 is selected by the first selection circuit S9 as the selected clock signal, the fourth secondary selection circuit S4 is turned on to supply the third primary delay output signal d3 to the eighth secondary delay buffer g8, and propagation of the clock signal from the seventh secondary delay buffer g7 to the eighth secondary delay buffer g8 is cut off. Therefore, the third primary delay output signal d3 and the seventh secondary delay output signal e7 are phase locked with each other. However, inasmuch as the first selection circuit S9 lies between the third primary delay output signal d3 and the seventh secondary delay output signal e7 on drawing, strictly speaking, the third primary delay output signal d3 and the seventh secondary delay output signal e7 have a phase difference therebetween that corresponds to the delay of the first selection circuit S9. Under the circumstances, referring to Table 2, the first secondary delay output signal e1 has the specified phase of 2457.2 ps. In the eighty-seventh synchronization state <087>, the second delay locked loop (not shown) feedback controls the delay buffer train 35 so that so that the sixteen-stage second delay line having the eighth secondary delay buffer g8 as the first-state delay buffer and having the seventh secondary delay buffer g7 as the last-stage delay buffer has the second total delay (including delays in the first through the eighth secondary selection circuits S1 to S8 and the eight dummy circuits 41) equal to one period of 3200 ps of the reference clock signal ref.clk.

In the manner which is described above, the digital phase control circuit according to the fourth embodiment of this invention and the delay locked loops have one of characteristics so as to configure the second delay line having a constant-stage (sixteen-stage in the fourth embodiment) including the first-stage and the last-stage (including intermediate-stages) circulated in position operate in the delay buffer train 35.

According to the digital phase control circuit of the fourth embodiment of this invention, it is possible to make and change fifty-six synchronization states <001> to <111> shown in Table 2. In addition, by using the first and the second delay locked loops, the first phase interval of the first multi-phase clock signals and the second phase interval of the second multi-phase clock signals are maintained to keep an equal interval with high precision. Accordingly, it is possible to infinitely (cyclically) phase shift (phase control) the sixteen second multi-phase clock signals with the second phase interval maintained to keep 200 ps as a whole with resolution of 57 ps and at high precision both in an advance or lead direction and in a delay or lag direction.

In the manner as described above, it is possible to phase shift the second multi-phase clock signals at the resolution of the length (phase) shorter than a difference between the first phase interval of the first multi-phase clock signals and the second phase interval of the second multi-phase clock signals.

Figure 11:
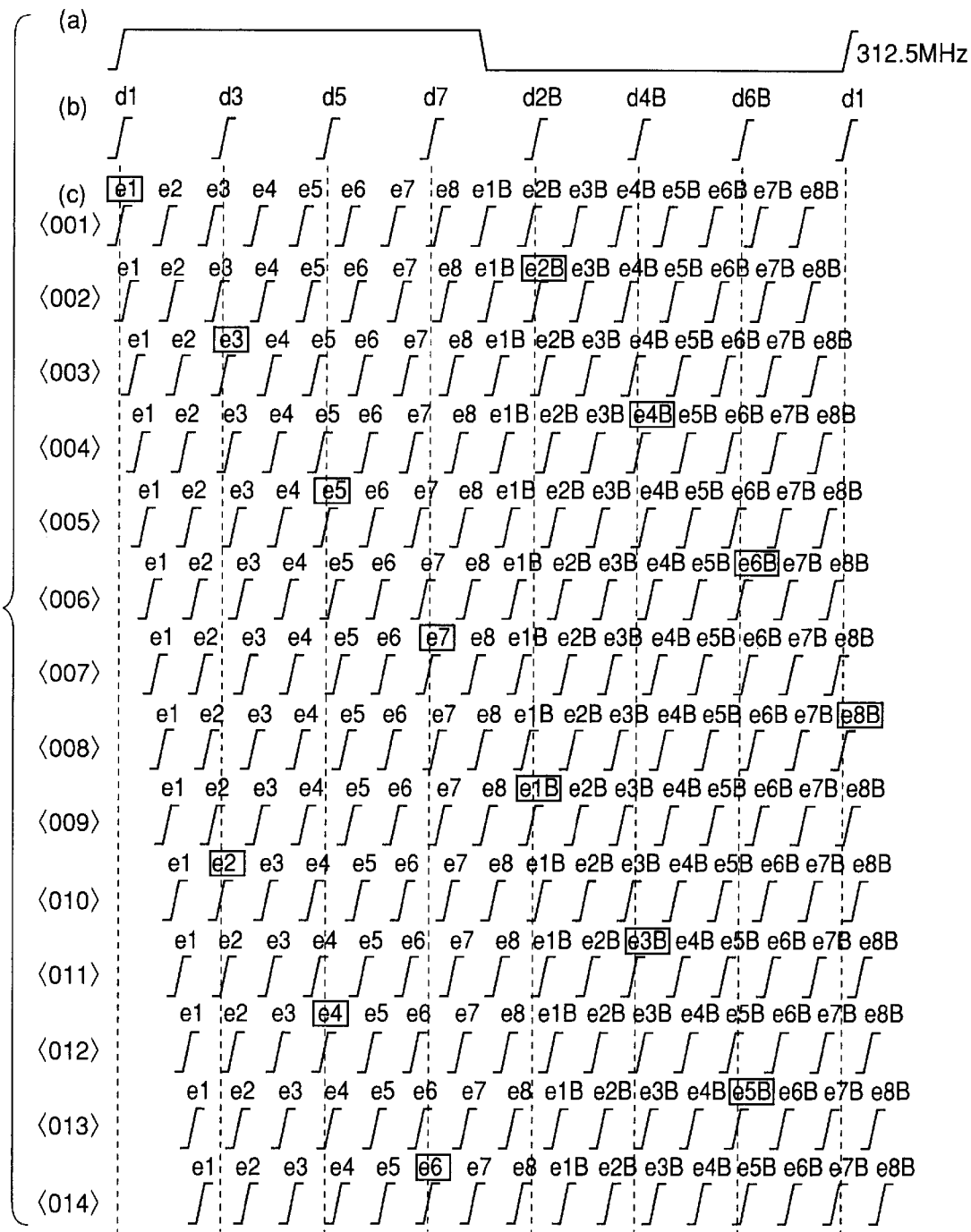
FIG. 11 is a time chart showing schematic waveforms indicative of position relationship of clock edges in the digital phase control circuit illustrated in FIG. 10.

In addition, by using the seven multi-phase clock signals and the sixteen multi-phase clock signals in the manner which is described above, it may be possible to carry out phase control so that the period of 3200 ps is divided by 112 at the resolution of 28.6 ps in the manner in the third embodiment. In this event, in regard to circuitry configuration of the above-mentioned fourth embodiment, eight additional secondary selection circuits are provided or disposed between the second and the third secondary delay buffers g2 and g3, between the fourth and the fifth secondary delay buffers g4 and g5, between the sixth and the seventh secondary delay buffers g6 and g7, between the eighth and the ninth secondary delay buffers g8 and g9, between the tenth and the eleventh secondary delay buffers g10 and g11, between the twelfth and the thirteenth secondary delay buffers g12 and g13, between the fourteenth and the fifteenth secondary delay buffers g14 and g15, and the sixteenth and the first secondary delay buffers g16 and g1. With this structure, inasmuch as it is possible to make and change one hundred and twelve synchronization states, it is possible to carry out phase control so that the period of 3200 ps is divided by 112 at the resolution of 28.6 ps in the similar manner in the third embodiment. In addition, inasmuch as the seven first multi-phase clock signals consist of the first primary delay output signal d1, the third primary delay output signal d3, the fifth primary delay output signal d5, the seventh primary delay output signal d7, the second inverted primary delay output signal d2B, the fourth inverted primary delay output signal d4B, and the sixth inverted primary delay output signal d6B without having the second primary delay output signal d2, the fourth primary delay output signal d4, the sixth primary delay output signal d6, the first inverted primary delay output signal d1B, the third inverted primary delay output signal d3B, the fifth inverted primary delay output signal d5B, and the seventh inverted primary delay output signal d7B, phase control illustrated in FIG. 11 and Table 3 is carried out.

TABLE 3

| A | B | C | D | E | F(C-E) |
|---|---|---|---|---|--------|
| <001> | d1 | 0.0 | e1 | 0.0 | 0.0 |
| <002> | d2B | 1828.8 | e2B | 1800.0 | 28.6 |
| <003> | d3 | 457.2 | e3 | 400.0 | 57.2 |
| <004> | d4B | 2286.0 | e4B | 2200.0 | 85.8 |
| <005> | d5 | 914.4 | e5 | 800.0 | 114.4 |
| <006> | d6B | 2743.2 | e6B | 2600.0 | 143.0 |
| <007> | d7 | 1371.6 | e7 | 1200.0 | 171.6 |
| <008> | d1 | 0.0 | e8B | 3000.0 | 200.2 |
| <009> | d2B | 1828.8 | e1B | 1600.0 | 228.8 |
| <010> | d3 | 457.2 | e2 | 200.0 | 257.4 |
| <011> | d4B | 2286.0 | e3B | 2000.0 | 286.0 |
| <012> | d5 | 914.4 | e4 | 600.0 | 314.6 |
| <013> | d6B | 2743.2 | e5B | 2400.0 | 343.2 |
| <014> | d7 | 1371.6 | e6 | 1000.0 | 371.8 |
| <015> | d1 | 0.0 | e7B | 2800.0 | 400.0 |
| <016> | d2B | 1828.0 | e8 | 1400.0 | 428.6 |
| <017> | d3 | 457.2 | e1 | 0.0 | 457.2 |
| <018> | d4B | 2286.0 | e2B | 1800.0 | 485.8 |
| <019> | d5 | 914.4 | e3 | 400.0 | 514.4 |
| <020> | d6B | 2743.2 | e4B | 2200.0 | 543.0 |
| <021> | d7 | 1371.6 | e5 | 800.0 | 571.6 |
| <022> | d1 | 0.0 | e6B | 2600.0 | 600.2 |
| <023> | d2B | 1828.8 | e7 | 1200.0 | 628.8 |
| <024> | d3 | 457.2 | e8B | 3000.0 | 657.4 |
| <025> | d4B | 2286.0 | e1B | 1600.0 | 686.0 |
| <026> | d5 | 914.4 | e2 | 200.0 | 714.6 |
| <027> | d6B | 2743.2 | e3B | 2000.0 | 743.2 |
| <028> | d7 | 1371.6 | e4 | 600.0 | 771.8 |
| <029> | d1 | 0.0 | e5B | 2400.0 | 800.0 |
| <030> | d2B | 1828.0 | e6 | 1000.0 | 828.6 |
| <031> | d3 | 457.2 | e7B | 2800.0 | 857.2 |
| <032> | d4B | 2286.0 | e8 | 1400.0 | 885.8 |
| <033> | d5 | 914.4 | e1 | 0.0 | 914.4 |
| <034> | d6B | 2743.2 | e2B | 1800.0 | 943.0 |
| <035> | d7 | 1371.6 | e3 | 400.0 | 971.6 |
| <036> | d1 | 0.0 | e4B | 2200.0 | 1000.2 |
| <037> | d2B | 1828.8 | e5 | 800.0 | 1028.8 |
| <038> | d3 | 457.2 | e6B | 2600.0 | 1057.4 |
| <039> | d4B | 2286.0 | e7 | 1200.0 | 1006.0 |
| <040> | d5 | 914.4 | e8B | 3000.0 | 1114.6 |
| <041> | d6B | 2743.2 | e1B | 1600.0 | 1143.2 |
| <042> | d7 | 1371.6 | e2 | 200.0 | 1171.8 |
| <043> | d1 | 0.0 | e3B | 2000.0 | 1200.0 |
| <044> | d2B | 1828.8 | e4 | 600.0 | 1228.6 |
| <045> | d3 | 457.2 | e5B | 2400.0 | 1257.2 |
| <046> | d4B | 2286.0 | e6 | 1000.0 | 1285.8 |
| <047> | d5 | 914.4 | e7B | 2800.0 | 1314.4 |
| <048> | d6B | 2743.2 | e8 | 1400.0 | 1343.0 |
| <049> | d7 | 1371.6 | e1 | 0.0 | 1371.6 |
| <050> | d1 | 0.0 | e2B | 1800.0 | 1400.2 |
| <051> | d2B | 1828.0 | e3 | 400.0 | 1428.8 |
| <052> | d3 | 457.2 | e4B | 2200.0 | 1457.4 |
| <053> | d4B | 2286.0 | e5 | 800.0 | 1486.0 |
| <054> | d5 | 914.4 | e6B | 2600.0 | 1514.6 |
| <055> | d6B | 2743.2 | e7 | 1200.0 | 1543.2 |
| <056> | d7 | 1371.6 | e8B | 3000.0 | 1571.8 |
| <058> | d2B | 1828.8 | e2 | 200.0 | 1628.6 |

TABLE 3-continued

| A | B | C | D | E | F(C–E) |
|---|---|---|---|---|---|
| <057> | d1 | 0.0 | e1B | 1600.0 | 1600.0 |
| <059> | d3 | 457.2 | e3B | 2000.0 | 1657.2 |
| <060> | d4B | 2286.0 | e4 | 600.0 | 1685.8 |
| <061> | d5 | 914.4 | e5B | 2400.0 | 1714.4 |
| <062> | d6B | 2743.2 | e6 | 1000.0 | 1743.0 |
| <063> | d7 | 1371.6 | e7B | 2800.0 | 1771.6 |
| <064> | d1 | 0.0 | e8 | 1400.0 | 1800.2 |
| <065> | d2B | 1828.0 | e1 | 0.0 | 1828.8 |
| <066> | d3 | 457.2 | e2B | 1800.0 | 1857.4 |
| <067> | d4B | 2286.0 | e3 | 400.0 | 1806.0 |
| <068> | d5 | 914.4 | e4B | 2200.0 | 1914.6 |
| <069> | d6B | 2743.2 | e5 | 800.0 | 1943.2 |
| <070> | d7 | 1371.6 | e6B | 2600.0 | 1971.8 |
| <071> | d1 | 0.0 | e7 | 1200.0 | 2000.0 |
| <072> | d2B | 1828.0 | e8B | 3000.0 | 2028.6 |
| <073> | d3 | 457.2 | e1B | 1600.0 | 2057.2 |
| <074> | d4B | 2286.0 | e2 | 200.0 | 2085.8 |
| <075> | d5 | 914.4 | e3B | 2000.0 | 2114.4 |
| <076> | d6B | 2743.2 | e4 | 600.0 | 2143.0 |
| <077> | d7 | 1371.6 | e5B | 2400.0 | 2171.6 |
| <078> | d1 | 0.0 | e6 | 1000.0 | 2200.2 |
| <079> | d2B | 1828.8 | e7B | 2800.0 | 2228.8 |
| <080> | d3 | 457.2 | e8 | 1400.0 | 2257.4 |
| <081> | d4B | 2286.0 | e1 | 0.0 | 2286.0 |
| <082> | d5 | 914.4 | e2B | 1800.0 | 2314.6 |
| <083> | d6B | 2743.2 | e3 | 400.0 | 2343.2 |
| <084> | d7 | 1371.6 | e4B | 2200.0 | 2371.8 |
| <085> | d1 | 0.0 | e5 | 800.0 | 2400.0 |
| <086> | d2B | 1828.8 | e6B | 2600.0 | 2428.6 |
| <087> | d3 | 457.2 | e7 | 1200.0 | 2457.2 |
| <088> | d4B | 2286.0 | e8B | 3000.0 | 2485.8 |
| <089> | d5 | 914.4 | e1B | 1600.0 | 2514.4 |
| <090> | d6B | 2743.2 | e2 | 200.0 | 2543.0 |
| <091> | d7 | 1371.6 | e3B | 2000.0 | 2571.6 |
| <092> | d1 | 0.0 | e4 | 600.0 | 2600.2 |
| <093> | d2B | 1828.8 | e5B | 2400.0 | 2628.8 |
| <094> | d3 | 457.2 | e6 | 1000.0 | 2657.4 |
| <095> | d4B | 2286.0 | e7B | 2800.0 | 2686.0 |
| <096> | d5 | 914.4 | e8 | 1400.0 | 2714.6 |
| <097> | d6B | 2743.2 | e1 | 0.0 | 2743.2 |
| <098> | d7 | 1371.6 | e2B | 1800.0 | 2771.8 |
| <099> | d1 | 0.0 | e3 | 400.0 | 2800.0 |
| <100> | d2B | 1828.8 | e4B | 2200.0 | 2828.6 |
| <101> | d3 | 457.2 | e5 | 800.0 | 2857.2 |
| <102> | d4B | 2286.0 | e6B | 2600.0 | 2885.8 |
| <103> | d5 | 914.4 | e7 | 1200.0 | 2914.4 |
| <104> | d6B | 2743.2 | e8B | 3000.0 | 2943.0 |
| <105> | d7 | 1371.6 | e1B | 1600.0 | 2971.6 |
| <106> | d1 | 0.0 | e2 | 200.0 | 3000.2 |
| <107> | d2B | 1828.0 | e3B | 2000.0 | 3028.8 |
| <108> | d3 | 457.2 | e4 | 600.0 | 3057.4 |
| <109> | d4B | 2286.0 | e5B | 2400.0 | 3086.0 |
| <110> | d5 | 914.4 | e6 | 1000.0 | 3114.6 |
| <111> | d6B | 2743.2 | e7B | 2800.0 | 3143.2 |
| <112> | d7 | 1371.6 | e8 | 1400.0 | 3171.8 |

That is, it is possible to successively phase shift the sixteen second multi-phase clock signals e1–e8, e1B–e8B 28.6 ps by 28.6 ps with the second phase interval maintained to keep 200 ps by changing a combination for the clock signals to be phase-locked at a first cycle of d1→d2B→d3→d4B→d5→d6B→d7 as regards the first multi-phase clock signals and at a second cycle of e1→e2B→e3→e4B→e5→e6B→e7→e8B→e1B→e2→e3B→e4→e5B→e6→e7B→e8 as regards the second multi-phase clock signals.

In the manner as described above, it is possible to phase shift the second multi-phase clock signals at the resolution of the length (phase) shorter than a difference between the first phase interval of the first multi-phase clock signals and the second phase interval of the second multi-phase clock signals.

Figure 12:
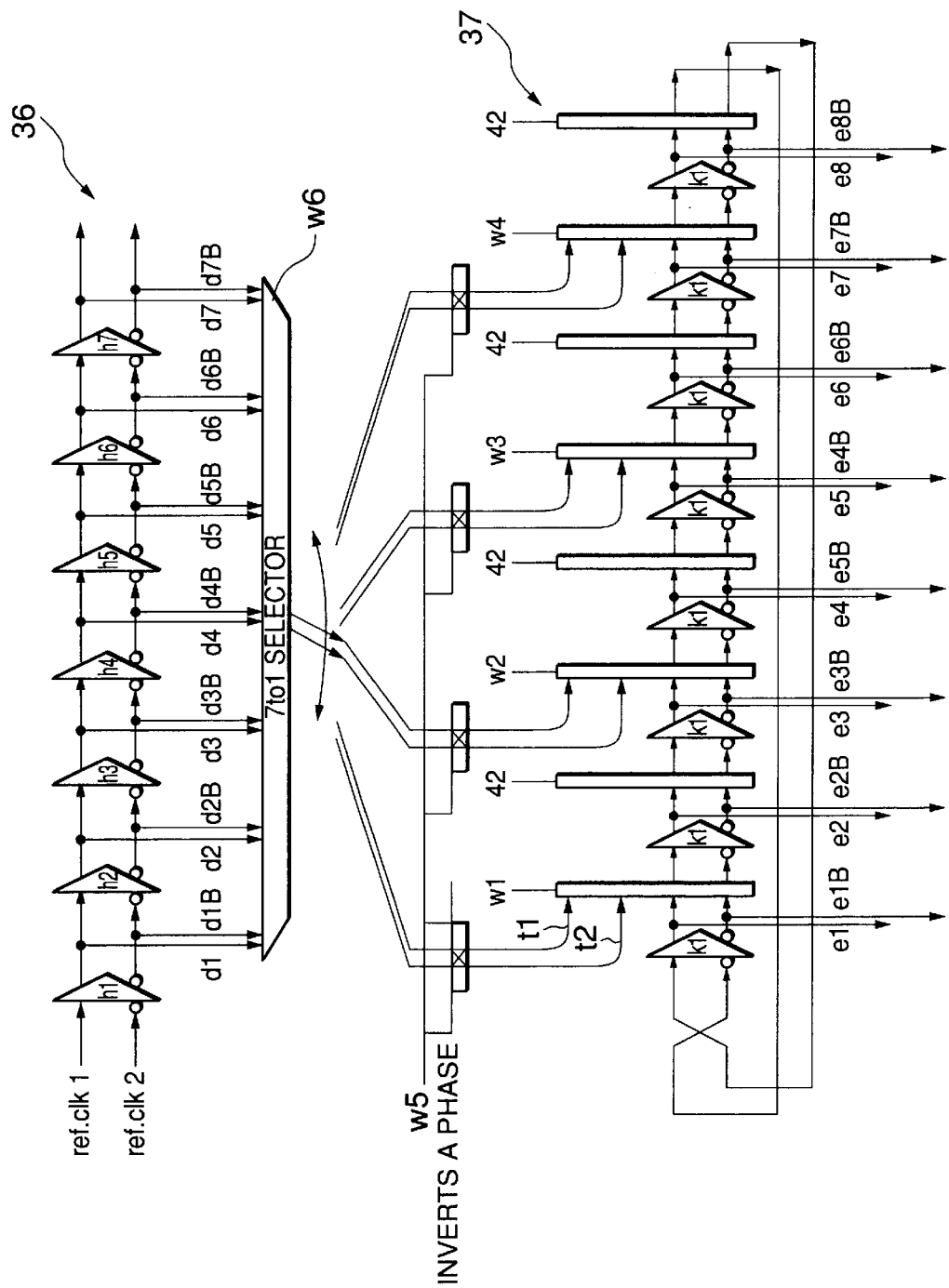
FIG. 12 is a schematic block diagram of a digital phase control circuit according to a fifth embodiment of this invention.

Referring now to FIG. 12, the description will proceed to a digital phase control circuit according to a fifth embodiment of this invention. FIG. 12 is a schematic block diagram of the digital phase control circuit according to the fifth embodiment of this invention. The illustrated digital phase control circuit is a circuit for realizing the digital phase control method according to the above-mentioned third embodiment.

The fifth embodiment is different from the fourth embodiment and is an embodiment in a case of phase controlling by differential circuitry configuration. The fourth embodiment is an embodiment in a case of phase controlling sixteen multi-phase clock signals at resolution of 3200 ps/56≈57 ps by changing 7×4×2=56 synchronization states using a combination of one pair of seven differential clock signal pairs and one pair of four differential clock signal pairs with them relatively inverted.

As shown in FIG. 12, the digital phase control circuit according to the fifth embodiment of this invention comprises a first delay line 36, a delay buffer train 37, a first selection circuit w6, a second selection section comprising first through fourth secondary selection circuits w1, w2, w3, and w4, and a switching circuit w5. The first delay line 36 comprises a seven-stage primary differential delay buffer or first through seventh primary differential delay buffers h1, h2, h3, h4, h5, h6, and h7 which are chained with each other. The first delay line 36 is feedback controlled by a first delay locked loop (not shown). The delay buffer train 37 comprises an eight-stage secondary differential delay buffer or first through eighth secondary differential delay buffers k1, k2, k3, k4, k5, k6, k7, and k8 which are chained with each other in a ring-shaped fashion. The first selection circuit w6 selects one of the first through the seventh primary differential delay buffers h1 to h7 to fetch a selected clock signal pair. The second selection circuit (w1–w4) is for selecting one of the first through the eighth secondary differential delay buffers k1 to k8 to supply with the selected clock signal pair. The switching circuit w5 is for switching inversion and non-inversion of the selected clock signal pair supplied to one of the second, the fourth, the sixth, and the eighth secondary differential delay buffers k2, k4, k6, and k8 of the delay buffer train 37.

In the second selection circuit, the first through the fourth secondary selection circuits w1 to w4 are disposed between the first and the second secondary differential delay buffers k1 and k2, between the third and the fourth secondary differential delay buffers k3 and k4, between the fifth and the sixth secondary differential delay buffers k5 and k6, and between the seventh and the eighth secondary differential delay buffers k7 and k8 in this order. Inasmuch as each of the first through the fourth secondary selection circuits w1 to w4 has a minute delay, four dummy circuits 42 each having an equivalent delay are disposed or inserted between the second and the third secondary differential delay buffers k2 and k3, between the fourth and the fifth secondary differential delay buffers k4 and k5, between the sixth and the seventh secondary differential delay buffers k6 and k7, and between the eighth and the first secondary differential delay buffers k8 and k1. With this structure, it is possible to generate more equal multi-phase clock signals.

Produced by the first delay line 36, fourteen first multi-phase clock signals correspond to the fourteen first multi-phase clock signals in the above-mentioned third embodiment and are therefore attached with similar reference symbols. That is, the first delay line 36 produces the fourteen first multi-phase clock signals d1–d7, d1B–d7B as differential pairs. A combination of the m-th primary delay output signal dm and the m-th inverted primary delay output signal dmB is called an m-th primary differential clock signal pair dm-dmB where m represents a first variable between 1 and 7, both inclusive. In addition, produced by the delay buffer train 37, sixteen second multi-phase clock signals correspond to the sixteen second multi-phase clock signals in the above-mentioned third embodiment and are therefore attached with similar reference symbols. That is, the delay buffer train 37 produces the sixteen second multi-phase clock signals e1–e8, e1B–e8B as differential pairs. A combination of the n-th secondary delay output signal en and the n-th inverted secondary delay output signal is referred to as an n-th secondary differential clock signal pair en-enB where n represents a second variable between 1 to 8, both inclusive.

In the fifth embodiment, only the synchronization states <001>, <003>, <005>, . . . , <111> having odd number in Table 1 are used. A list of each synchronization state in the fifth embodiment is illustrated in Table 4 as follows.

TABLE 4

| A | B | C | D | E | F(C-E) | w5 | w(X) |
|---|---|---|---|---|---|---|---|
| <001> | d1 | 0.0 | e1 | 0.0 | 0.0 | off | w1 |
| <003> | d3 | 457.2 | e3 | 400.0 | 57.2 | off | w2 |
| <005> | d5 | 914.4 | e5 | 800.0 | 114.4 | off | w3 |
| <007> | d7 | 1371.6 | e7 | 1200.0 | 171.6 | off | w4 |
| <009> | d2B | 1828.8 | e1B | 1600.0 | 228.8 | on | w1 |
| <011> | d4B | 2286.0 | e3B | 2000.0 | 286.0 | on | w2 |
| <013> | d6B | 2743.2 | e5B | 2400.0 | 343.2 | on | w3 |
| <015> | d1 | 0.0 | e7B | 2800.0 | 400.0 | on | w4 |
| <017> | d3 | 457.2 | e1 | 0.0 | 457.2 | off | w1 |
| <019> | d5 | 914.4 | e3 | 400.0 | 514.4 | off | w2 |
| <021> | d7 | 1371.6 | e5 | 800.0 | 571.6 | off | w3 |
| <023> | d2B | 1828.8 | e7 | 1200.0 | 628.8 | off | w4 |
| <025> | d4B | 2286.0 | e1B | 1600.0 | 686.0 | on | w1 |
| <027> | d6B | 2743.2 | e3B | 2000.0 | 743.2 | on | w2 |
| <029> | d1 | 0.0 | e5B | 2400.0 | 800.0 | on | w3 |
| <031> | d3 | 457.2 | e7B | 2800.0 | 857.2 | on | w4 |
| <033> | d5 | 914.4 | e1 | 0.0 | 914.off | | w1 |
| <035> | d7 | 1371.6 | e3 | 400.0 | 971.6 | off | w2 |
| <037> | d2B | 1828.8 | e5 | 800.0 | 1028.8 | off | w3 |
| <039> | d4B | 2286.0 | e7 | 1200.0 | 1086.0 | off | w4 |
| <041> | d6B | 2743.2 | e1B | 1600.0 | 1143.2 | on | w1 |
| <043> | d1 | 0.0 | e3B | 2000.0 | 1200.0 | on | w2 |
| <045> | d3 | 457.2 | e5B | 2400.0 | 1257.2 | on | w3 |
| <047> | d5 | 914.4 | e7B | 2800.0 | 1314.4 | on | w4 |
| <049> | d7 | 1371.6 | e1 | 0.0 | 1371.6 | off | w1 |
| <051> | d2B | 1828.8 | e3 | 400.0 | 1428.8 | off | w2 |
| <053> | d4B | 2288.0 | e5 | 800.0 | 1486.0 | off | w3 |
| <055> | d6B | 2743.2 | e7 | 1200.0 | 1543.2 | off | w4 |
| <057> | d1 | 0.0 | e1B | 1600.0 | 1600.0 | on | w1 |
| <059> | d3 | 457.2 | e3B | 2000.0 | 1057.2 | on | w2 |
| <061> | d5 | 914.4 | e5B | 2400.0 | 1714.4 | on | w3 |
| <063> | d7 | 1371.6 | e7B | 2800.0 | 1771.6 | on | w4 |
| <065> | d2B | 1828.8 | e1 | 0.0 | 1828.8 | off | w1 |
| <067> | d4B | 2286.0 | e3 | 400.0 | 1886.0 | off | w2 |
| <069> | d6B | 2743.2 | e5 | 800.0 | 1943.2 | off | w3 |
| <071> | d1 | 0.0 | e7 | 1200.0 | 2000.0 | off | w4 |
| <073> | d3 | 457.2 | e1B | 1600.0 | 2057.2 | on | w1 |
| <075> | d5 | 914.4 | e3B | 2000.0 | 2114.4 | on | w2 |
| <077> | d7 | 1371.6 | e5B | 2400.0 | 2171.6 | on | w3 |
| <079> | d2B | 1820.8 | e7B | 2800.0 | 2228.8 | on | w4 |
| <081> | d4B | 2286.0 | e1 | 0.0 | 2286.0 | off | w1 |
| <083> | d6B | 2743.2 | e3 | 400.0 | 2343.2 | off | w2 |
| <085> | d1 | 0.0 | e5 | 800.0 | 2400.0 | off | w3 |
| <087> | d3 | 457.2 | e7 | 1200.0 | 2457.2 | off | w4 |
| <089> | d5 | 914.4 | e1B | 1600.0 | 2514.4 | on | w1 |
| <091> | d7 | 1371.6 | e3B | 2000.0 | 2571.6 | on | w2 |
| <093> | d2B | 1828.8 | e5B | 2400.0 | 2628.8 | on | w3 |
| <095> | d4B | 2286.0 | e7B | 2800.0 | 2686.0 | on | w4 |
| <097> | d6B | 2743.2 | e1 | 0.0 | 2743.2 | off | w1 |
| <099> | d1 | 0.0 | e3 | 400.0 | 2800.0 | off | w2 |
| <101> | d3 | 457.2 | e5 | 800.0 | 2857.2 | off | w3 |
| <103> | d5 | 914.4 | e7 | 1200.0 | 2914.4 | off | w4 |
| <105> | d7 | 1371.6 | e1B | 1600.0 | 2971.6 | on | w1 |
| <107> | d2B | 1828.8 | e3B | 2000.0 | 3028.8 | on | w2 |
| <109> | d4B | 2286.0 | e5B | 2400.0 | 3086.0 | on | w3 |
| <111> | d6B | 2743.2 | e7B | 2800.0 | 3143.2 | on | w4 |

The items A to F in Table 4 are identical to those where only the synchronization states having the odd numbers of Table 1 are extracted. An item w5 represents an on/off state of the switching circuit w5. An item w(x) represents a reference number of the selection circuit which is put into an on state among the first through the fourth secondary selection circuits w1 to w4. When one of the first through the fourth secondary selection circuits w1 to w4 is put into the on state, remaining three secondary selection circuits are put into an off state. That is, there is no two or more selection circuits which are simultaneously put into the on state among the first through the fourth secondary selection circuits w1 to w4. The secondary selection circuits put into the off state among the first through the fourth secondary selection circuits w1 to w4 are omitted from Table 4.

A first reference clock signal ref.clk1 and a second reference clock signal ref.clk2 have a phase difference of half period with each other and are differential signals which form differential pairs. The first and the second reference clock signals ref.clk1 and ref.clk2 are generated and supplied from an external phase-locked loop (PLL) or the like.

The first delay locked loop (not shown) comprises a first phase-frequency comparator, a first charge pump, a first low pass filter, and so on. The first delay locked loop detects a first phase difference by phase comparing the first reference clock signal ref.clk1 supplied to the first primary differential delay buffer h1 with the seventh inverted primary delay output signal d7B produced by the seventh primary differential delay buffer h7. In addition, the first delay locked loop detects a second phase difference by phase comparing the second reference clock signal ref.clk2 supplied to the first primary differential delay buffer h1 with the seventh primary delay output signal d7 produced by the seventh primary differential delay buffer h7. Furthermore, the first delay locked loop generates a first control voltage on the basis of the first and the second phase differences and supplies the first control voltage to the first through the seventh primary differential delay buffers h1 to h7 to feedback control the first delay line 36 so that the first delay line 37 has a first total delay equal to half period of 1600 ps of the first and the second reference clock signals ref.clk1 and ref.clk2. With this structure, each of the first through the seventh primary differential delay buffers h1 to h7 has a first propagation delay to keep equal to (1600/7)ps and the fourteen first multi-phase clock signals d1–d7, d1B–d7B have a first phase interval to keep equal to (1600/7)ps.

The first selection circuit w6 carries out a selection of the first primary differential clock signal pair d1–d1B, the second inverted primary differential clock signal pair d2B-s2, the third primary differential clock signal pair d3-d3B, the fourth inverted primary differential clock signal pair d4B-d4, the fifth primary differential clock signal pair d5-d5B, the sixth inverted primary differential clock signal pair d6B-d6, and the seventh primary differential clock signal pair d7-d7B. The first selection circuit w6 produces one of those seven primary differential clock signal pairs d1-d1B, d2B-d2, d3-d3B, d4B-d4, d5-d5B, d6B-d6, and d7-d7B as a selected primary differential clock signal pair.

The switching circuit w6 inverts the selected primary differential clock signal pair to produce an inverted primary differential clock signal pair as a passed primary differential clock signal pair when the switching circuit w6 is turned on. When the switching circuit w6 is turned off, the switching circuit w6 passes the selected primary differential clock signal pair as the passed primary differential clock signal pair as it is. In addition, on describing, the m-th primary differential clock signal pair dm-dmB and the m-th inverted primary differential clock signal pair dmB-dm are inverted with each other, where m represents a variable between 1 and 7, both inclusive.

It will be assumed that the switching circuit w5 is turned off so that the selected primary differential clock signal pair is not inverted. In this event, the first primary delay output signal d1, the second inverted primary delay output signal d2B, the third primary delay output signal d3, the fourth inverted primary delay output signal d4B, the fifth primary delay output signal d5, the sixth inverted primary delay output signal d6B, and the seventh primary delay output signal d7 are supplied to an upper stage side of the delay buffer train 37 or to a side of the first through the eighth secondary delay output signals e1 to e8 while the first inverted primary delay output signal d1B, the second primary delay output signal d2, the third inverted primary delay output signal d3B, the fourth primary delay output signal d4, the fifth inverted primary delay output signal d5B, the sixth primary delay output signal d6, and the seventh inverted primary delay output signal d7B are supplied to a lower stage side of the delay buffer train 37 or to a side of the first through the eighth inverted secondary delay output signals e1B to e8B.

It will be assumed that the first secondary selection circuit w1 is turned on. In this event, the primary differential clock signal pair, which is selected by the first selection circuit w1 and passes through the switching circuit w5, is supplied to the second secondary differential delay buffer k2 and propagation of the clock signal from the first secondary differential delay buffer k1 to the second secondary differential delay buffer k2 is cut off. Under the circumstances, the second through the fourth secondary selection circuits w2 to w4 are turned off so that input/output of the clock signals are not carried out. On switching of the first through the fourth secondary selection circuits w1 to w4, a second delay locked loop (not shown) feedback controls the delay buffer train 37 so that the second delay line having the second secondary differential delay buffer k2 as a first-stage differential delay buffer and having the first secondary differential delay buffer k1 as a last-stage differential delay buffer has a second total delay (including delays of the first through the fourth secondary selection circuits w1 to w4 and the four dummy circuits 42) equal to half period of 1600 ps of the first and the second reference clock signals ref.clk1 and ref.clk2.

Inasmuch as each of the first through the fourth secondary selection circuits w1 to w4 and the four dummy circuits 42 has a minute propagation delay, strictly speaking, the delay buffer train 37 comprises the first through the fourth secondary selection circuits w1 to w4, the four dummy circuits 42, and the first through the second secondary differential delay buffers k1 to k8. And, the second delay locked loop (not shown) controls the second delay line by phase comparing an input differential clock signal pair t1, t2 supplied to the first secondary selection circuit w1 with an output differential clock signal pair e1, e1B produced by the first secondary differential delay buffer k1. One t1 of the input differential clock signal pair t1, t2 is supplied to the upper stage side of the delay buffer train 37 or to the side of the first through the eighth secondary delay output signals e1–e8 while another t2 of the input differential clock signal pair t1, t2 is supplied to the lower stage side of the delay buffer train 37 or to the side of the first through the eighth inverted secondary delay output signals e1B–e8B. The second delay locked loop (not shown) phase compares the input differential clock signal t1 with the first secondary delay output signal e1 and phase compares the input differential clock signal t2 with the first inverted secondary delay output signal e1B. by the feedback control of the second delay locked loop, each of the first through the eighth secondary differential delay buffers k1 to k8 has a second propagation delay so at to keep (1600/8)ps and the sixteen second multi-phase clock signals e1–e8, e1B–e8B have the second phase interval so at to keep (1600/8)ps.

Operations of the second through the fourth secondary selection circuits w2 to w4 and the second delay locked loop (not shown) accompanied with this are similar. As described above, each of the first through the fourth secondary selection circuits w1 to w4 serves as an arrangement for cutting off a signal in the delay buffer train 37.

For example, in the first synchronization state <001>, the first primary differential clock signal pair d1-d1B is selected as the selected primary differential clock signal pair by the first selection circuit w6, the switching circuit w5 is turned off to pass the first primary differential clock signal pair d1-d1B as the passed primary differential clock signal pair as it is. In addition, the first secondary selection circuit w1 is turned on to supply the first primary differential clock signal pair d1-d1B to the second secondary differential delay buffer k2 and to cut off propagation of the clock signal from the first secondary differential delay buffer k1 to the second secondary differential delay buffer k2. Therefore, the first primary delay output signal d1 and the first secondary delay output signal e1 are phase locked with each other. However, inasmuch as the first selection circuit w6 and the switching circuit w5 lie between the first primary delay output signal d1 and the first secondary delay output signal e1 on drawing, strictly speaking, the first primary delay output signal d1 and the first secondary delay output signal e1 have a phase difference therebetween that corresponds to a delay of the first selection circuit w6 and the switching circuit w5. Under the circumstances, referring to Table 4, the first secondary delay output signal e1 has the specified phase of 0 ps. In the first synchronization state <001>, the second delay locked loop (not shown) feedback controls the delay buffer train 37 so that the second delay line, which has the second secondary differential delay buffer k2 as the first-stage differential delay buffer and has the first secondary differential delay buffer k1 as the last-stage differential delay buffer, has the second total delay (including the delays of the first through the fourth secondary selection circuits w1 to w4 and the four dummy circuits 42) equal to half period of 1600 ps of the clock signal.

In addition, for instance, in the eleventh synchronization state <011>, the fourth inverted primary differential clock signal pair d4B-d4 is selected as the selected primary differential clock signal pair by the first selection circuit w6 and the switching circuit w5 is turned on to invert the fourth inverted primary differential clock signal pair d4B-d4 into the fourth differential clock signal pair d4-d4B which passes through the switching circuit w5 as the passed differential clock signal pair. In addition, the second secondary selection circuit w2 is turned on to supply the fourth primary differential clock signal pair d4-d4B to the fourth secondary differential delay buffer k4 and to cut off propagation of the clock signal from the third secondary differential delay buffer k3 to the fourth secondary differential delay buffer k4. Therefore, the fourth inverted primary delay output signal d4B and the third inverted secondary delay output signal e3B are phase locked with each other. However, inasmuch as the first selection circuit w6 and the switching circuit w5 lie between the fourth inverted primary delay output signal d4B and the third inverted secondary delay output signal e3B on drawing, strictly speaking, the fourth inverted primary delay output signal d4B and the third inverted secondary delay output signal e3B have a phase difference therebetween that corresponds to the delay of the first selection circuit w6 and the switching circuit w5. Under the circumstances, referring to Table 4, the first secondary delay output signal e1 has the specified phase of 286 ps. In the eleventh synchronization state <011>, the second delay locked loop (not shown) feedback controls the delay buffer train 37 so that the second delay line, which has the fourth secondary differential delay buffer k4 as the first-stage differential delay buffer and has the third secondary differential delay buffer k3 as the last-stage differential delay buffer, has the second total delay (including the delays of the first through the fourth secondary selection circuits w1 to w4 and the four dummy circuits 42) equal to half period of 1600 ps of the clock signal.

In addition, for example, in the eighty-third synchronization state <083>, the sixth inverted primary differential clock signal pair d6B-d6 is selected as the selected primary differential clock signal pair by the first selection circuit w6, the switching circuit w5 is turned off to pass the sixth inverted primary differential clock signal pair d6B-d6 as the passed primary differential clock signal pair without inverting as it is. In addition, the second secondary selection circuit w2 is turned on to supply the sixth inverted primary differential clock signal pair d6B-d6 to the fourth secondary differential delay buffer k4 and to cut off propagation of the clock signal from the third secondary differential delay buffer k3 to the fourth secondary differential delay buffer k4. Therefore, the sixth inverted primary delay output signal d6B and the third secondary delay output signal e3 are phase locked with each other. However, inasmuch as the first selection circuit w6 and the switching circuit w5 lie between the sixth inverted primary delay output signal d6B and the third secondary delay output signal e3 on drawing, strictly speaking, the sixth inverted primary delay output signal d6B and the third secondary delay output signal e3 have a phase difference therebetween that corresponds to the delay of the first selection circuit w6 and the switching circuit w5. Under the circumstances, referring to Table 4, the first secondary delay output signal e1 has the specified phase of 2343.2 ps. In the eighty-third synchronization state <083>, the second delay locked loop (not shown) feedback controls the delay buffer train 37 so that the second delay line, which has the fourth secondary differential delay buffer k4 as the first-stage differential delay buffer and has the third secondary differential delay buffer k3 as the last-stage differential delay buffer, has the second total delay (including the delays of the first through the fourth secondary selection circuits w1 to w4 and the four dummy circuits 42) equal to half period of 1600 ps of the clock signal.

In the manner which is described above, the digital phase control circuit according to the fifth embodiment of this invention and the delay locked loops have one of characteristics so as to configure the second delay line having a constant-stage (eight-stage in the fifth embodiment) including the first-stage and the last-stage (including intermediate-stages) circulated in position operate in the delay buffer train 37.

According to the digital phase control circuit of the fifth embodiment of this invention, it is possible to make and change fifty-six synchronization states <001> to <111> shown in Table 4. In addition, by using the first and the second delay locked loops, the first phase interval of the first multi-phase clock signals and the second phase interval of the second multi-phase clock signals are maintained to keep an equal interval at high precision. Accordingly, it is possible to infinitely (cyclically) phase shift (phase control) the sixteen second multi-phase clock signals e1–e8, e1B–e8B with the second phase interval maintained to keep 200 ps as a whole at resolution of 57 ps and with high precision both in an advance or lead direction and in a delay or lag direction.

In addition, in regard to circuitry configuration of the above-mentioned fifth embodiment, four additional secondary selection circuits may be provided or disposed between the second and the third secondary differential delay buffers k2 and k3, between the fourth and the fifth secondary differential delay buffers k4 and k5, between the sixth and the seventh secondary differential delay buffers k6 and k7, and between the eighth and the first secondary differential delay buffers k8 and k1. With this structure, inasmuch as it is possible to make and change one hundred and twelve synchronization states of <001> to <112> illustrated in Table 1, it is possible to carry out phase control so that the period of 3200 ps is divided by 112 at the resolution of 28.6 ps in the similar manner in the third embodiment.

Figure 13:
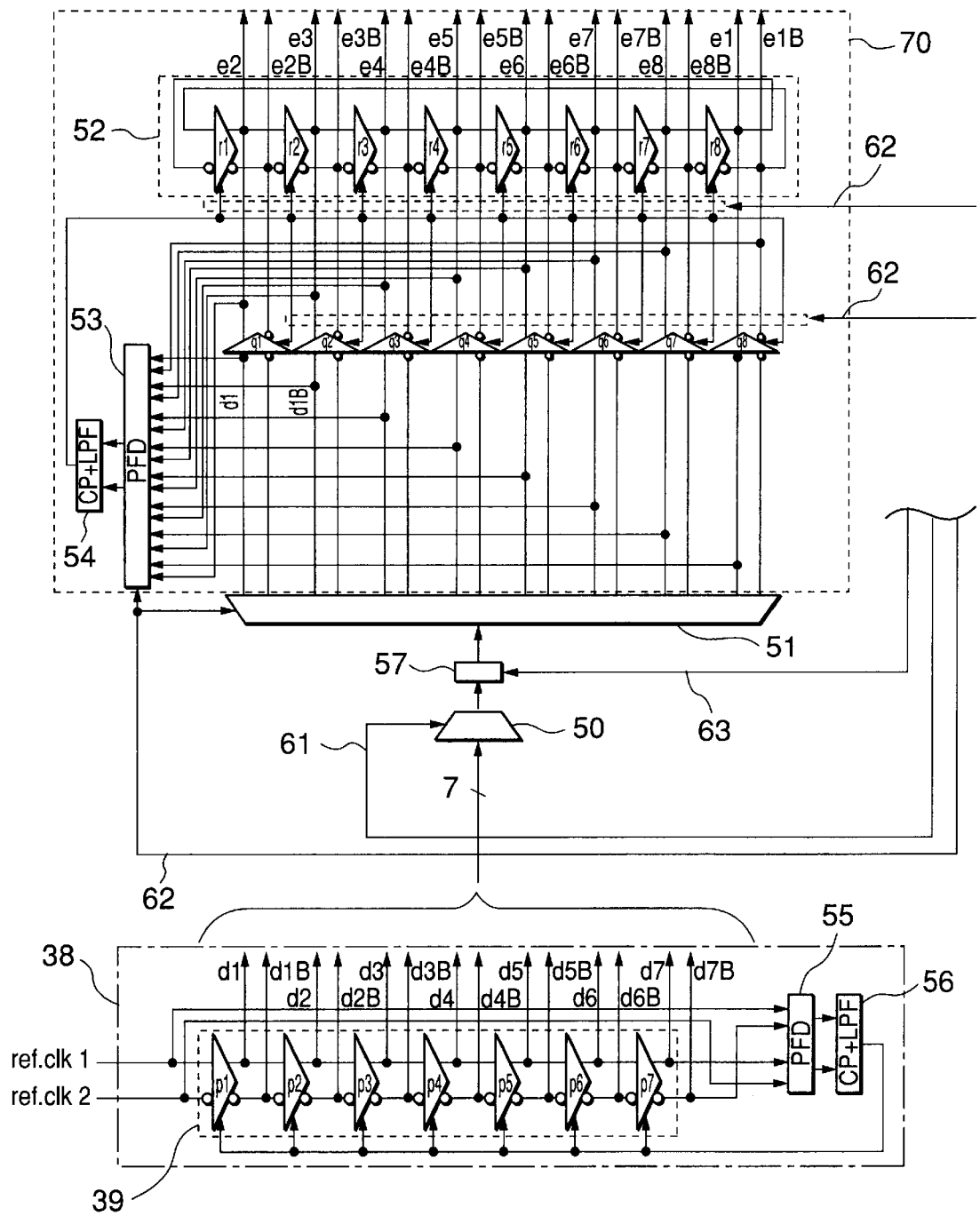
FIG. 13 is a schematic block diagram of a digital phase control circuit according to a sixth embodiment of this invention.

Referring now to FIG. 13, the description will proceed to a digital phase control circuit according to a sixth embodiment of this invention. FIG. 13 is a schematic block diagram of the digital phase control circuit according to the sixth embodiment of this invention. The illustrated digital phase control circuit is a circuit for realizing the digital phase control method according to the above-mentioned third embodiment.

The sixth embodiment is similar to the fifth embodiment and is an embodiment in a case of phase controlling by differential circuitry configuration. However, different from the fifth embodiment, the sixth embodiment is an embodiment in a case of phase controlling sixteen multi-phase clock signals at resolution of 3200 ps/112≈28.6 ps by changing 7×8×2=112 synchronization states using a combination of one pair of seven differential clock signal pairs and one pair of eight differential clock signal pairs with them relatively inverted.

As shown in FIG. 13, the digital phase control circuit according to the sixth embodiment of this invention comprises a first delay line 39, a first selection circuit 50, eight differential delay buffers q1, q2, q3, q4, q5, q6, q7, and q8, a switching circuit 57, a second selection circuit 51, and a delay buffer train 52. The first delay line 39 comprises a seven-stage primary differential delay buffer or first through seventh primary differential delay buffers p1, p2, p3, p4, p5, p6, and p7. The first delay line 38 is feedback controlled by a first delay locked loop 38. The first selection circuit 50 is connected to outputs of the first through the seventh primary differential delay buffers p1 to p7. The first selection circuit 50 selects one of the outputs of the first through the seventh primary differential delay buffers p1 to p7. The switching circuit 57 receives a selected primary clock signal pair from the first selection circuit 50 and switches inversion and non-inversion of the selected primary clock signal pair. The second selection circuit 51 receives the passed primary clock signal pair from the first selection circuit 50 through the switching circuit 57. The eight differential delay buffers q1 to q8 are connected in parallel to an output of the second selection circuit 51. The eight differential delay buffers q1 to q8 are called first through eighth ternary differential delay buffers.

The delay buffer train 52 comprises an eight-stage secondary differential delay buffer, namely, first through eighth secondary differential delay buffers r1, r2, r3, r4, r5, r6, r7, and r8 which are chained with each other in a ring-shaped fashion. The first through the eighth secondary differential delay buffers r1 to r8 have characteristics equal to those of the first through the eighth ternary differential delay buffers q1 to q8. Outputs of the first through the eighth ternary differential delay buffers q1 to q8 are connected to between respective adjacent two ones of the first through the eighth secondary differential delay buffers r1 to r8. A second phase-frequency comparator 53 is connected to inputs of the first through the eighth ternary differential delay buffers q1 to q8 and to outputs of the first through the eighth secondary differential delay buffers r1 to r8.

The first selection circuit 50 is supplied with a first selection control signal 61. Responsive to the first selection control signal 61, the first selection circuit 50 selects one pair of first through seventh primary differential clock signal pairs d1-d1B, d2-d2B, d3-d3B, d4-d4B, d5-d5B, d6-d6B, and d7-d7B supplied from the first through the seventh primary differential delay buffers p1 to p7 to produce or fetch the selected primary differential clock signal pair.

The switching circuit 57 is supplied with a third selection control signal 63. Responsive to the third selection control signal 63, the switching circuit 57 switches the inversion and the non-inversion of the selected primary differential clock signal pair to produce the passed primary differential clock signal pair.

The second selection circuit 51 is supplied with a second selection control signal 62 and receives the passed primary differential clock signal pair from the first selection circuit 30 through the switching circuit 57. Responsive to the second selection control signal 62, the second selection circuit 51 selects one of the first through the eighth ternary differential delay buffers q1 to q8 as a selected ternary differential delay buffer to supply the selected ternary differential delay buffer to the passed primary differential clock signal pair.

The second phase-frequency comparator 53 is supplied with the second selection control signal 62. Responsive to the second selection control signal 62, the second phase-frequency phase comparator 53 selects one of first through eighth secondary delay output signals e1 to e8 from the first through the eighth secondary differential delay buffers r1 to r8 as a selected secondary delay output signal to receive the selected secondary delay output signal.

The first through the eighth ternary differential delay buffers q1 to q8 have respective current sources (not shown) supplied with the second selection control signal 62. Responsive to the second selection control signal 62, only one of the current sources for the first through the eighth ternary differential delay buffers q1 to q8 is turned on so as to put only one of the first through the eight ternary differential delay buffers q1 to q8 into an on state as an active ternary differential delay buffer. In this event, remaining seven ternary differential delay buffers are put into off states as inactive ternary differential delay buffers.

The first through the eighth secondary differential delay buffers r1 to r8 have respective current sources (not shown) supplied with the second selection signal 62. Responsive to the second selection control signal 62, only one of the current sources for the first through the eighth secondary differential delay buffers r1 to r8 is turned off so as to put only one of the first through the eighth secondary differential delay buffers r1 to r8 into an off state as an inactive secondary differential delay buffer. In this event, remaining seven secondary differential delay buffers are put into on states as active secondary differential delay buffers.

In addition, in a case of a single-phase circuitry configuration, the switching circuit 57 is not necessary. In the case of the single-phase circuitry configuration, in order to obtain the same resolution in this embodiment, it is necessary to increase the number of stages of each delay line twice.

Produced by the first delay line 39, fourteen first multi-phase clock signals correspond to the fourteen first multi-phase clock signals in the above-mentioned third embodiment and are therefore attached with similar reference symbols. That is, the first delay line 39 produces the fourteen first multi-phase clock signals d1–d7, d1B–d7B as differential pairs. In the similar manner which is described above, a combination of the m-th primary delay output signal dm and the m-th inverted primary delay output signal dmB is called an m-th primary differential clock signal pair dm-dmB where m represents a first variable between 1 and 7, both inclusive. In addition, produced by the delay buffer train 52, sixteen second multi-phase clock signals correspond to the sixteen second multi-phase clock signals in the above-mentioned third embodiment and are therefore attached with similar reference symbols. That is, the delay buffer train 52 produces the sixteen second multi-phase clock signals e1–e8, e1B–e8B as differential pairs. In the similar manner which is described above, a combination of the n-th secondary delay output signal en and the n-th inverted secondary delay output signal is referred to as an n-th secondary differential clock signal pair en-enB where n represents a second variable between 1 to 8, both inclusive.

In the digital phase control circuit of the sixth embodiment, it is possible to create or make 112 synchronization states illustrated in Table 1. Referring to Table 1 again. In Table 1, an item G represents an on/off state of the switching circuit 57.

A first reference clock signal ref.clk1 and a second reference clock signal ref.clk2 have a phase difference of half period with each other and are a differential signal pair which forms differential pairs. The first and the second reference clock signals ref.clk1 and ref.clk2 are generated and supplied from an external phase-locked loop (PLL) or the like.

The first delay locked loop 38 comprises a first phase-frequency comparator (PFD) 55 and a first charge pump and low pass filter (CP+LPF) 56. The first phase-frequency comparator 55 phase compares the first reference clock signal ref.clk1 supplied to the first primary differential delay buffer p1 with the seventh invereted primary delay output signal d7B produced by the seventh primary differential delay buffer p7 to detect a first primary phase difference therebetween. In addition, the first phase-frequency comparator 55 phase compares the second reference clock signal ref.clk2 supplied to the first primary differential delay buffer p1 with the seventh primary delay output signal d7 produced by the seventh primary differential delay buffer p7 to detect a second primary phase difference therebetween. The first charge pump and low pass filter 56 generates a first control voltage on the basis of the first and the second primary phase differences and supplies the first control voltage to the first through the seventh primary differential delay buffers p1 to p7 to feedback control the first delay line 39 so that the first delay line 39 has a first total delay equal to half period of 1600 ps of the first and the second reference clock signals ref.clk1 and ref.clk2. With this structure, each of the first through the seventh primary differential delay buffers p1 to p7 has a first propagation delay to keep equal to (1600/7)ps and the fourteen first multi-phase clock signals d1–d7, d1B–d7B have a first phase interval to keep equal to (1600/7)ps.

The first selection circuit 50 carries out, in response to the first selection control signal 61, a selection operation of the first through the seventh primary differential clock signal pairs d1-d1B, d2-d2B, d3-d3B, d4-d4B, d5-d5B, d6-d6B, and d7-d7B and first through seventh inverted primary differential clock signal pairs d1B-d1, d2B-d2, d3B-d3, d4B-d4, d5B-d5, d6B-d6, and d7B-d7. The first selection circuit 50 produces, as a selected primary differential clock signal pair, one of the first through the seventh primary differential clock signal pairs d1-d1B, d2-d2B, d3-d3B, d4-d4B, d5-d5B, d6-d6B, and d7-d7B and the first through the seventh inverted primary differential clock signal pairs d1B-d1, d2B-d2, d3B-d3, d4B-d4, d5B-d5, d6B-d6, and d7B-d7.

The switching circuit 57 inverts the selected primary differential clock signal pair to produce an inverted primary differential clock signal pair as the passed primary differential clock signal pair when the switching circuit 57 is turned on in response to the third selection control signal 63. When the switching circuit 57 is turned off in response to the third selection control signal 63, the switching circuit 57 passes the selected primary differential clock signal pair without inverting as it is as the passed primary differential clock signal pair. In addition, on describing, the m-th primary differential clock signal pair dm-dmB and the m-th inverted primary differential clock signal pair dmB-dm are inverted with each other, where m represents a variable between 1 and 7, both inclusive.

The second selection circuit 51 receives the passed primary differential clock signal pair which is selected by the first selection circuit 50 and which passes through the switching circuit 57. Responsive to the second selection control signal 62, the second selection circuit 51 selects one of the first through the eighth ternary differential delay buffers q1 to q8 as the selected ternary differential delay buffer to supply the selected ternary differential delay buffer with the passed primary differential clock signal pair. The selected ternary differential delay buffer always acts as a first-stage of a second delay line which will later become clear. Therefore, the first through the eighth ternary differential delay buffers q1 to q8 are called first-stage delay buffers. On changing of the first selection circuit 51, the second phase-frequency comparator (PFD)53 selects, in response to the second selection control signal 62, an output of the last-stage of the second delay line among the first through the eighth secondary differential delay buffers r1 to r8 to receive the output in question. A second delay locked loop 70 includes the second phase-frequency comparator 53 and a second charge pump and low pass filter (CP+LPF) 54. The second delay locked loop 70 is called a rotation DLL. The rotation DLL 70 feedback controls the delay buffet train 52 so that the second delay line has a second total delay equal to half period of 1600 ps of the clock signal.

The rotation DLL 70 comprises the first through the eighth ternary differential delay buffers q1 to q8, the delay buffer train 52, the second phase-frequency comparator 53, and the second charge pump and low pass filter 54. The rotation DLL 70 always feedback controls the delay buffer train 52 which changes in position on the circuit.

Figure 14A:
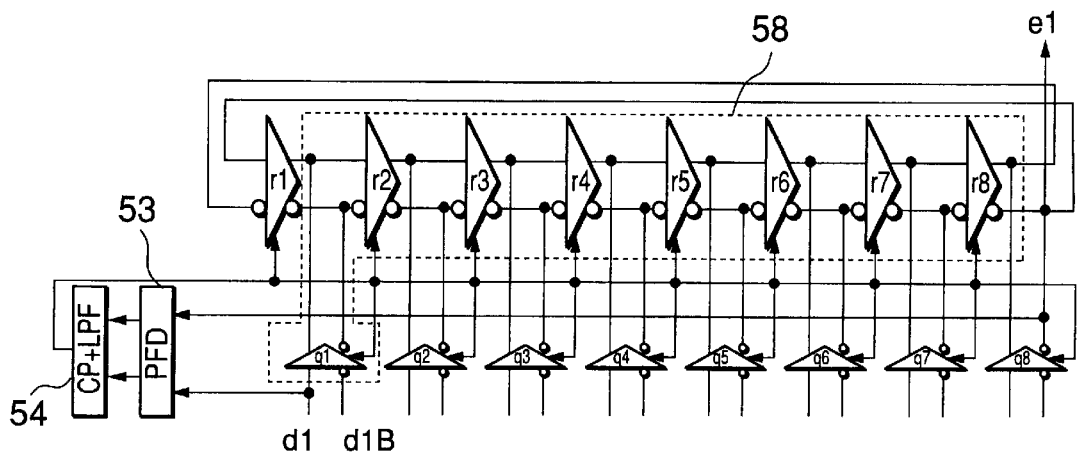
FIGS. 14A through 14F show rotation DLL in first, second, third, eighth, ninth, and thirty-first synchronization states for use in the digital phase control circuit illustrated in FIG. 13.
Figure 14B:
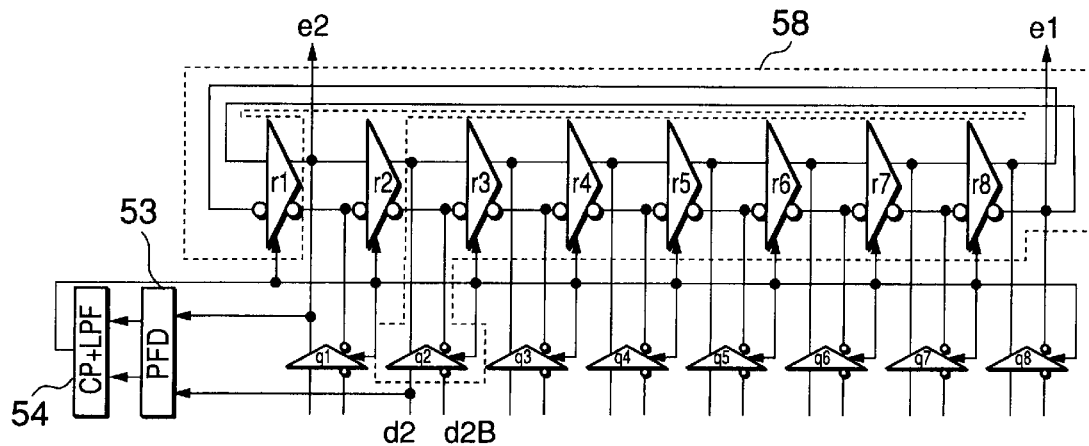
Figure 14C:
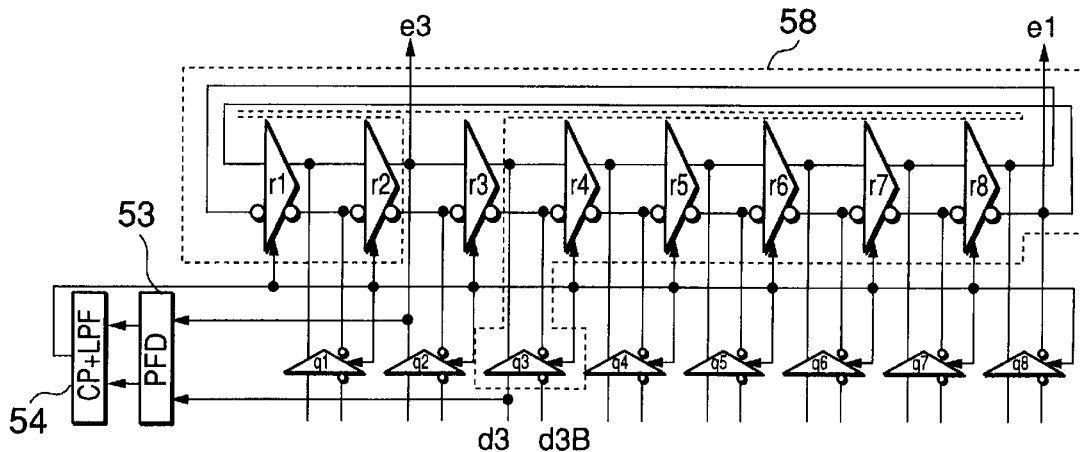
Figure 14D:
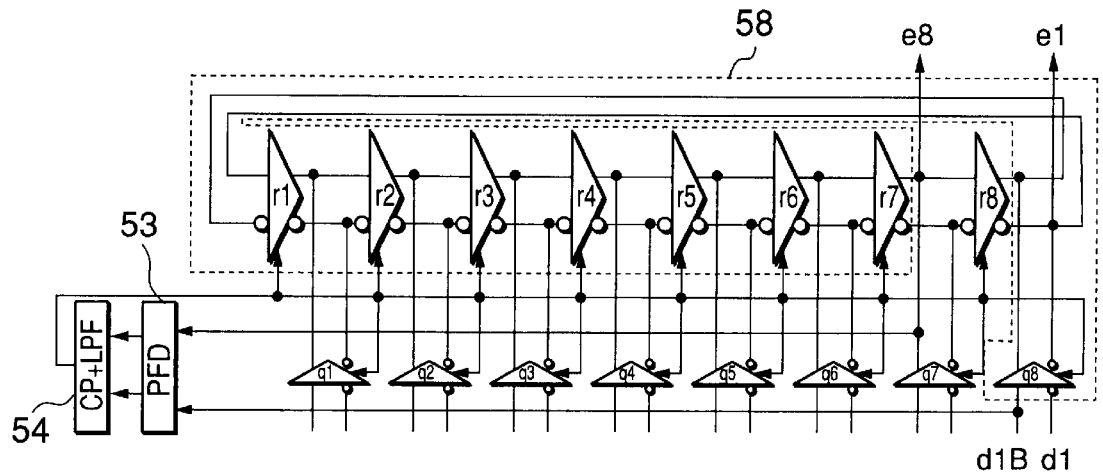
Figure 14E:
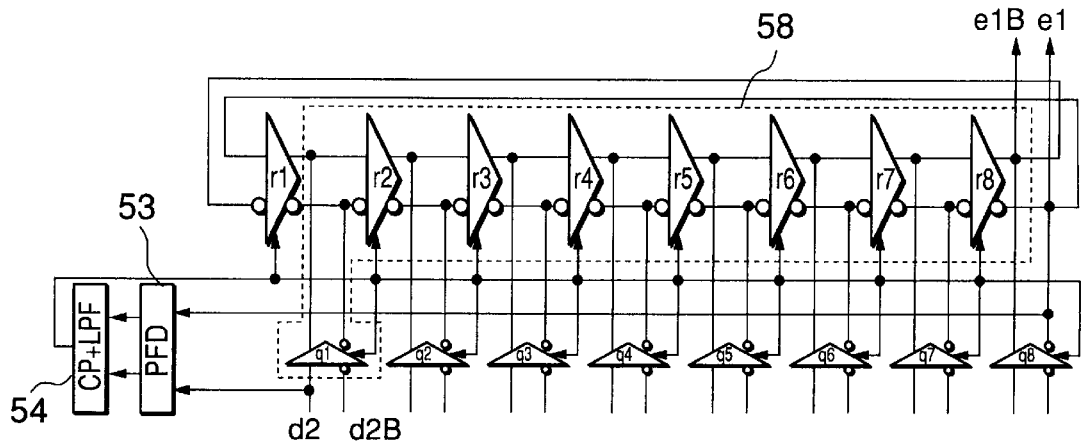
Figure 14F:
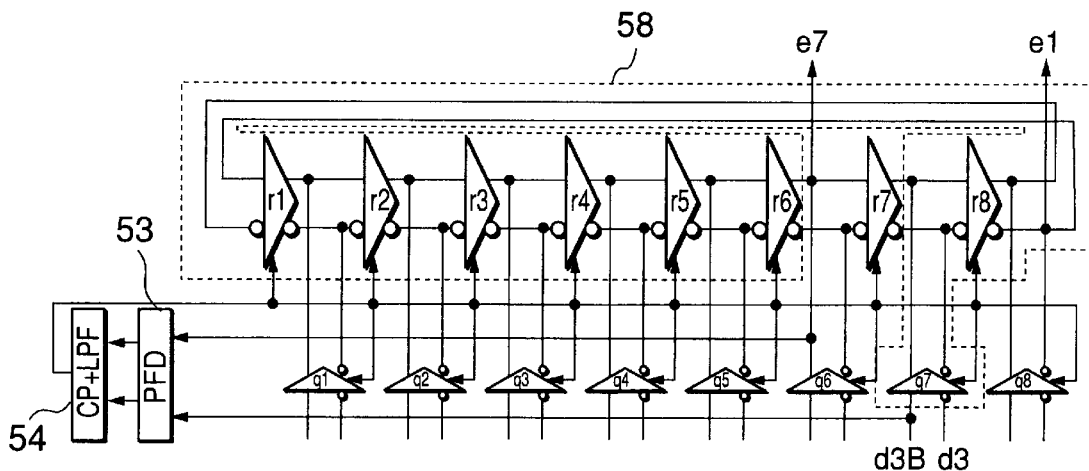

Referring to FIGS. 14A through 14F in addition to FIG. 13, the description will be made as regards operation of the digital phase control circuit illustrated in FIG. 13. Each of FIGS. 14A through 14F shows the rotation DLL 70 for use in the digital phase control circuit illustrated in FIG. 13. FIG. 14A shows the rotation DLL 70 in the first synchronization state <001>. FIG. 14B shows the rotation DLL 70 in the second synchronization state <002>. FIG. 14C shows the rotation DLL 70 in the third synchronization state <003>. FIG. 14D shows the rotation DLL 70 in the eighth synchronization state <008>. FIG. 14E shows the rotation DLL 70 in the ninth synchronization state <009>. FIG. 14F shows the rotation DLL 70 in the thirty-first synchronization state <031>.

Referring now to FIGS. 13 and 14A, the description will be made as regards operation in the first synchronization state <001>.

In the first synchronization state <001>, the first selection circuit 50 selects the first primary differential clock signal pair d1-d1B as the selected primary differential clock signal pair. The switching circuit 57 is turned off to pass the first primary differential clock signal pair d1-d1B as the passed primary differential clock signal pair as it is. In addition, as shown in FIG. 14A, the second selection circuit 51 supplies the first primary differential clock signal pair d1-d1B to the first ternary differential delay buffer q1. The second phase-frequency comparator 53 receives the first primary delay output signal d1 as an input clock signal of the second delay line 58 and the first secondary delay output signal e1 produced by the eighth secondary differential delay buffer r8 as an output clock signal of the second delay line 58. The second phase-frequency comparator 53 detects the second phase difference between the input clock signal d1 and the output clock signal e1 of the second delay line 58 to produce a detection result (phase difference information) indicative of the second phase difference. The rotation DLL 70 feedback controls, on the basis of the detection result (phase difference information), the eight-stage second delay line 58 consisting of the first ternary differential delay buffer q1 and the second through the eighth secondary differential delay buffer r2 to r8 so that the eight-stage second delay line 58 has the second total delay equal to the half period (1600 ps) of the clock signal. By the feedback control of the rotation DLL 70, each of the first ternary differential delay buffer q1 and the second through the eighth secondary differential delay buffer r2 to r8 has the second propagation delay to keep equal to (1600/8)ps and the sixteen second multi-phase clock signals e1–e8, e1B–e8B have the second phase interval to keep equal to (1600/8)ps. Supplied to the second delay line 58 from the first ternary differential delay buffer q1 (the first-stage), the first primary delay output signal d1 is propagated through the second through the eighth secondary differential delay buffers r2→r3→r4→r5→r6→r7→r8 and is cut off by the first secondary differential delay buffer r1 which is turned off in response to the second selection control signal 62. Each of the first through the eighth secondary differential delay buffers r1 to r8 serves as an arrangement for cutting off propagation of the signal in the delay buffer train 52. When each of the first through the eighth secondary differential delay buffers r1 to r8 corresponds to the next stage of the last-stage of the second delay line 58, it is turned off to give play to a function for cutting off the propagation.

According to Table 1, in the first synchronization state <001>, the first secondary delay output signal e1 has the specified phase of 0 ps. This is confirmed by referring to FIG. 14A. Inasmuch as the first secondary delay output signal e1 is a lower-stage output of the eighth secondary differential delay buffer r8, the specified phase of the first second delay output signal e1 becomes equal to 3200 ps or 0 ps obtained by adding the second total delay 200 ps×8= 1600 ps of the first ternary differential delay buffer q1 and the second through the eighth secondary differential delay buffers r2 to r8 to a phase 1600 ps of the first primary inverted delay output signal d1B.

Referring now to FIGS. 13 and 14B, the description will be made as regards operation in the second synchronization state <002>.

In the second synchronization state <002>, the first selection circuit 50 selects the second primary differential clock signal pair d2-d2B as the selected primary differential clock signal pair. The switching circuit 57 is turned off to pass the second primary differential clock signal pair d2-d2B as the passed primary differential clock signal pair as it is. In addition, as shown in FIG. 14B, the second selection circuit 51 supplies the second primary differential clock signal pair d2-d2B to the second ternary differential delay buffer q2. The second phase-frequency comparator 53 receives the second primary delay output signal d2 as the input clock signal of the second delay line 58 and the second secondary delay output signal e2 produced by the first secondary differential delay buffer r1 as the output clock signal of the second delay line 58. The second phase-frequency comparator 53 detects the second phase difference between the input clock signal d2 and the output clock signal e2 of the second delay line 58 to produce the detection result (phase difference information) indicative of the second phase difference. The rotation DLL 70 feedback controls, on the basis of the detection result (phase difference information), the eight-stage second delay line 58 consisting of the second ternary differential delay buffer q2, the third through the eighth secondary differential delay buffer r3 to r8, and the first secondary differential delay buffer r1 so that the eight-stage second delay line 58 has the second total delay equal to the half period (1600 ps) of the clock signal. By the feedback control of the rotation DLL 70, each of the second ternary differential delay buffer q2, the third through the eighth secondary differential delay buffer r3 to r8, and the first secondary differential delay buffer r1 has the second propagation delay to keep equal to (1600/8)ps and the sixteen second multi-phase clock signals e1–e8, e1B–e8B have the second phase interval to keep equal to (1600/8)ps. Supplied to the second delay line 58 from the second ternary differential delay buffer q2 (the first-stage), the second primary delay output signal d2 is propagated through the third through the eighth secondary differential delay buffers and the first secondary differential delay buffer (the last stage) r3→r4→r5→r6→r7→r8→r1 and is cut off by the second secondary differential delay buffer r2 which is turned off in response to the second selection control signal 62.

According to Table 1, in the second synchronization state <002>, the first secondary delay output signal e1 has the specified phase of 28.6 ps. This is confirmed by referring to FIG. 14B. Inasmuch as the first secondary delay output signal e1 is the lower-stage output of the eighth secondary differential delay buffer r8, the specified phase of the first second delay output signal e1 becomes equal to 3228.6 ps or 28.6 ps obtained by adding the second total delay 200 ps×7=1400 ps of the second ternary differential delay buffer q2 and the third through the eighth secondary differential delay buffers r3 to r8 to a phase 1828.6 ps of the second inverted primary delay output signal d2B.

Referring now to FIGS. 13 and 14C, the description will be made as regards operation in the third synchronization state <003>.

In the third synchronization state <003>, the first selection circuit 50 selects the third primary differential clock signal pair d3-d3B as the selected primary differential clock signal pair. The switching circuit 57 is turned off to pass the third primary differential clock signal pair d3-d3B as the passed primary differential clock signal pair as it is. In addition, as shown in FIG. 14C, the second selection circuit 51 supplies the third primary differential clock signal pair d3-d3B to the third ternary differential delay buffer q3. The second phase-frequency comparator 53 receives the third primary delay output signal d3 as the input clock signal of the second delay line 58 and the third secondary delay output signal e3 produced by the second secondary differential delay buffer r2 as the output clock signal of the second delay line 58. The second phase-frequency comparator 53 detects the second phase difference between the input clock signal d3 and the output clock signal e3 of the second delay line 58 to produce the detection result (phase difference information) indicative of the second phase difference. The rotation DLL 70 feedback controls, on the basis of the detection result (phase difference information), the eight-stage second delay line 58 consisting of the third ternary differential delay buffer q3, the fourth through the eighth secondary differential delay buffer r4 to r8, and the first and the second secondary differential delay buffers r1 and r2 so that the eight-stage second delay line 58 has the second total delay equal to the half period (1600 ps) of the clock signal. By the feedback control of the rotation DLL 70, each of the third ternary differential delay buffer q3, the fourth through the eighth secondary differential delay buffer r4 to r8, and the first and the second secondary differential delay buffer r1 and r2 has the second propagation delay to keep equal to (1600/8)ps and the sixteen second multi-phase clock signals e1–e8, e1B–e8B have the second phase interval to keep equal to (1600/8)ps. Supplied to the second delay line 58 from the third ternary differential delay buffer q3 (the first-stage), the third primary delay output signal d3 is propagated through the fourth through the eighth secondary differential delay buffers and the first and second secondary differential delay buffers r4→r5→r6→r7→r8→r1→r2 and is cut off by the third secondary differential delay buffer r3 which is turned off in response to the second selection control signal 62.

According to Table 1, in the third synchronization state <003>, the first secondary delay output signal e1 has the specified phase of 57.2 ps. This is confirmed by referring to FIG. 14C. Inasmuch as the first secondary delay output signal e1 is the lower-stage output of the eighth secondary differential delay buffer r8, the specified phase of the first second delay output signal e1 becomes equal to 3257.2 ps or 57.2 ps obtained by adding the second total delay 200 ps×6=1200 ps of the third ternary differential delay buffer q3 and the fourth through the eighth secondary differential delay buffers r4 to r8 to a phase 2057.2 ps of the third inverted primary delay output signal d3B.

Referring now to FIGS. 13 and 14D, the description will be made as regards operation in the eighth synchronization state <008>.

In the eighth synchronization state <008>, the first selection circuit 50 selects the first inverted primary differential clock signal pair d1B-d1 as the selected primary differential clock signal pair. The switching circuit 57 is turned off to pass the first inverted primary differential clock signal pair d1B-d1 as the passed primary differential clock signal pair as it is. In addition, as shown in FIG. 14D, the second selection circuit 51 supplies the first inverted primary differential clock signal pair d1B-d1 to the eighth ternary differential delay buffer q8. The second phase-frequency comparator 53 receives the first inverted primary delay output signal d1B as the input clock signal of the second delay line 58 and the eighth secondary delay output signal e8 produced by the seventh secondary differential delay buffer r7 as the output clock signal of the second delay line 58. The second phase-frequency comparator 53 detects the second phase difference between the input clock signal d1B and the output clock signal e8 of the second delay line 58 to produce the detection result (phase difference information) indicative of the second phase difference. The rotation DLL 70 feedback controls, on the basis of the detection result (phase difference information), the eight-stage second delay line 58 consisting of the eighth ternary differential delay buffer q8 and the first through the seventh secondary differential delay buffer r1 to r7 so that the eight-stage second delay line 58 has the second total delay equal to the half period (1600 ps) of the clock signal. By the feedback control of the rotation DLL 70, each of the eighth ternary differential delay buffer q8 and the first through the seventh secondary differential delay buffer r1 to r7 has the second propagation delay to keep equal to (1600/8)ps and the sixteen second multi-phase clock signals e1–e8, e1B–e8B have the second phase interval to keep equal to (1600/8)ps. Supplied to the second delay line 58 from the eighth ternary differential delay buffer q8 (the first-stage), the first inverted primary delay output signal d1B is propagated through the first through the seventh secondary differential delay buffers r1→r2→r3→r4→r5→r6→r7 and is cut off by the eighth secondary differential delay buffer r8 which is turned off in response to the second selection control signal 62.

According to Table 1, in the eighth synchronization state <008>, the first secondary delay output signal e1 has the specified phase of 200 ps. This is confirmed by referring to FIG. 14D. Inasmuch as the first secondary delay output signal e1 is the lower-stage output of the eighth secondary differential delay buffer r8, the specified phase of the first second delay output signal e1 becomes equal to 200 ps obtained by adding the delay 200 ps×1=200 ps of the eighth ternary differential delay buffer q8 to a phase 0 ps of the first primary inverted delay output signal d1.

Referring now to FIGS. 13 and 14E, the description will be made as regards operation in the ninth synchronization state <009>.

In the ninth synchronization state <009>, the first selection circuit 50 selects the second inverted primary differential clock signal pair d2B-d2 as the selected primary differential clock signal pair. The switching circuit 57 is turned on to invert the second inverted primary differential clock signal pair d2B-d2 into the second primary differential clock signal pair d2-d2B as the passed primary differential clock signal pair. In addition, as shown in FIG. 14E, the second selection circuit 51 supplies the second primary differential clock signal pair d2-d2B to the first ternary differential delay buffer q1. The second phase-frequency comparator 53 receives the second primary delay output signal d2 as the input clock signal of a second delay line 58 and the first secondary delay output signal e1 produced by the eighth secondary differential delay buffer r8 as an output clock signal of the second delay line 58. The second phase-frequency comparator 53 detects the second phase difference between the input clock signal d2 and the output clock signal e1 of the second delay line 58 to produce a detection result (phase difference information) indicative of the second phase difference. The rotation DLL 70 feedback controls, on the basis of the detection result (phase difference information), the eight-stage second delay line 58 consisting of the first ternary differential delay buffer q1 and the second through the eighth secondary differential delay buffer r2 to r8 so that the eight-stage second delay line 58 has the second total delay equal to the half period (1600 ps) of the clock signal. By the feedback control of the rotation DLL 70, each of the first ternary differential delay buffer q1 and the second through the eighth secondary differential delay buffer r2 to r8 has the second propagation delay to keep equal to (1600/8)ps and the sixteen second multi-phase clock signals e1–e8, e1B–e8B have the second phase interval to keep equal to (1600/8)ps. Supplied to the second delay line 58 from the first ternary differential delay buffer q1 (the first-stage), the second primary delay output signal d2 is propagated through the second through the eighth secondary differential delay buffers r2→r3→r4→r5→r6→r7→r8 and is cut off by the first secondary differential delay buffer r1 which is turned off in response to the second selection control signal 62.

According to Table 1, in the ninth synchronization state <009>, the first secondary delay output signal e1 has the specified phase of 228.8 ps. This is confirmed by referring to FIG. 14E. Inasmuch as the first secondary delay output signal e1 is a lower-stage output of the eighth secondary differential delay buffer r8, the specified phase of the first second delay output signal e1 becomes equal to 3428.8 ps or 228.8 ps obtained by adding the second total delay 200 ps×8=1600 ps of the first ternary differential delay buffer q1 and the second through the eighth secondary differential delay buffers r2 to r8 to a phase 1828.8 ps of the second inverted primary inverted delay output signal d2B.

Referring now to FIGS. 13 and 14F, the description will be made as regards operation in the thirty-first synchronization state <031>.

In the thirty-first synchronization state <031>, the first selection circuit 50 selects the third primary differential clock signal pair d3-d3B as the selected primary differential clock signal pair. The switching circuit 57 is turned on to invert the third primary differential clock signal pair d3-d3B into the third inverted primary differential clock signal pair d3B-d3 as the passed primary differential clock signal pair. In addition, as shown in FIG. 14F, the second selection circuit 51 supplies the third inverted primary differential clock signal pair d3B-d3 to the seventh ternary differential delay buffer q7. The second phase-frequency comparator 53 receives the third inverted primary delay output signal d3B as the input clock signal of a second delay line 58 and the seventh secondary delay output signal e7 produced by the sixth secondary differential delay buffer r6 as an output clock signal of the second delay line 58. The second phase-frequency comparator 53 detects the second phase difference between the input clock signal d3B and the output clock signal e7 of the second delay line 58 to produce a detection result (phase difference information) indicative of the second phase difference. The rotation DLL 70 feedback controls, on the basis of the detection result (phase difference information), the eight-stage second delay line 58 consisting of the seventh ternary differential delay buffer q7, the eighth secondary differential delay buffer r8, and the first through the sixth secondary differential delay buffers r1 to r6 so that the eight-stage second delay line 58 has the second total delay equal to the half period (1600 ps) of the clock signal. By the feedback control of the rotation DLL 70, each of the seventh ternary differential delay buffer q1, the eighth secondary differential delay buffer r8, and the first through the sixth secondary differential delay buffer r1 to r6 has the second propagation delay to keep equal to (1600/8)ps and the sixteen second multi-phase clock signals e1–e8, e1B–e8B have the second phase interval to keep equal to (1600/8)ps. Supplied to the second delay line 58 from the seventh ternary differential delay buffer q7 (the first-stage), the third inverted primary delay output signal d3B is propagated through the eighth secondary differential buffer r8 and the first through the sixth secondary differential delay buffers r8→r1→r2→r3→r4→r5→r6 and is cut off by the seventh secondary differential delay buffer r7 which is turned off in response to the second selection control signal 62.

According to Table 1, in the thirty-first synchronization state <031>, the first secondary delay output signal e1 has the specified phase of 857.2 ps. This is confirmed by referring to FIG. 14F. Inasmuch as the first secondary delay output signal e1 is the lower-stage output of the eighth secondary differential delay buffer r8, the specified phase of the first second delay output signal e1 becomes equal to 857.2 ps obtained by adding the second total delay 200 ps×2=400 ps of the seventh and the eighth secondary differential delay buffers r7 and r8 to a phase 457.2 ps of the third primary delay output signal d3.

In the manner which is described above, the digital phase control circuit according to the sixth embodiment of this invention and the delay locked loops have one of characteristics so as to make the second delay line 58 having a constant-stage (eight-stage in the sixth embodiment) the last-stage circulated in position operate in the delay buffer train 52.

According to the digital phase control circuit of the sixth embodiment of this invention, it is possible to make and change one hundred and twelve synchronization states <001> to <112> shown in Table 1. In addition, by using the first and the second delay locked loops, the first phase interval of the first multi-phase clock signals and the second phase interval of the second multi-phase clock signals are maintained to keep an equal interval with high precision. Accordingly, it is possible to infinitely (cyclically) phase shift (phase control) the sixteen second multi-phase clock signals with the second phase interval maintained to keep 200 ps as a whole at resolution of 28.6 ps and with high precision both in an advance or a lead direction and in a delay or a lag direction.

While this invention has thus far been described in conjunction with preferred embodiments thereof, it will now be readily possible for those skilled in the art to put this invention into various other manners.

What is claimed is:

1. A digital phase control method comprising the steps of:
   generating first multi-phase clock signals having a fixed phase and having a first equal phase interval using a first delay line comprising a plurality of primary delay buffers which are chained with each other;
   selecting one of the first multi-phase clock signal to pick up a selected clock signal; and
   supplying said selected clock signal to one of secondary delay buffers chained with each other in a second delay line to generate second multi-phase clock signals having a second equal phase interval different from the first equal phase interval using said second delay line;
   wherein the secondary delay buffers of said second delay line are chained with each other in a ring-shaped fashion.

2. A digital phase control method as claimed in claim 1, wherein said first delay line is feedback controlled by a first delay locked loop and said second delay line being feedback controlled by a second delay locked loop.

3. A digital phase control circuit comprising;
   a first delay line comprising M primary delay buffers which are chained with each other where M represents a first positive integer which is not less than two, said first delay line being feedback controlled by a first delay locked loop to produce first through M-th primary delay output signals;
   a delay buffer train comprising N or more secondary delay buffers which are chained with each other where N represents a second positive integer which is not less than two and which is different from the first positive integer M;
   a first selection circuit for selecting one of said first through said M-th primary delay output signals as a selected primary delay output signal;
   a second selection circuit for selecting one of said n or more stage secondary buffers as a first stage of a second delay line in said delay buffer train to supply the selected primary delay output signal to the first stage, said second delay line comprising N successive secondary delay buffers having a first one of said N successive secondary delay buffers as the first stage; and
   a secondary delay locked loop for feedback controlling said second delay line;
   wherein the N or more secondary delay buffers of said delay buffer train are chained with each other in a ring-shaped fashion.

4. A digital phase control circuit as claimed in claim 3, wherein each of said M primary delay buffers and said N or more secondary delay buffers has a single-phase configuration.

5. A digital phase control circuit as claimed in claim 3, wherein each of said M primary delay buffers and said N or more secondary delay buffers has a differential configuration.

6. A digital phase control circuit as claimed in claim 5, said first delay line producing first though M-th primary differential clock signal pairs as said first through said M-th primary delay output signals, said first selection circuit producing a selected primary differential clock pair as said selected primary delay output signal, wherein said digital phase control circuit further comprises a switching circuit for switching inversion and non-inversion of said selected primary differential clock pair.

7. A digital phase control circuit comprising:
   a first delay line comprising M primary delay buffers which are chained with each other where M represents a first positive integer which is not less than two, said first delay line being feedback controlled by a first delay locked loop to produce first through M-th primary delay output signals;
   a delay buffer train comprising N or more secondary delay buffers which are chained with each other where N represents a second positive integer which is not less than two and which is different from the first positive integer M;
   a first selection circuit for selecting one of said first through said M-th primary delay output signals as a selected primary delay output signal;
   a second selection circuit for selecting one of said n or more stage secondary buffers as a first stage of a second delay line in said delay buffer train to supply the selected primary delay output signal to the first stage, said second delay line comprising N successive secondary delay buffers having a first one of said N successive secondary delay buffers as the first stage; and
   a second delay locked loop for feedback controlling said second delay line; and
   wherein each of said M primary delay buffers and said N or more secondary delay buffers has a single-phase configuration; and
   wherein each of said M primary delay buffers and said N or more secondary delay buffers has a differential configuration.

8. A digital phase control circuit as claimed in claim 7, said first delay line producing first though M-th primary differential clock signal pairs as said first through said M-th primary delay output signals, said first selection circuit producing a selected primary differential clock pair as said selected primary delay output signal, wherein said digital phase control circuit further comprises a switching circuit for switching inversion and non-inversion of said selected primary differential clock pair.

9. A digital phase control circuit comprising:
   a first delay line comprising M primary delay buffers which are chained with each other where M represents a first positive integer which is not less than two, said first delay line being feedback controlled by a first delay locked loop to produce first through M-th primary delay output signals;
   a delay buffer train comprising N secondary delay buffers which are chained with each other in a ring-shaped fashion where N represents a second positive integer which is not less than two and which is different from the first positive integer M;
   N first-stage delay buffers having outputs connected between respective adjacent two of said N secondary delay buffers, each of said N first-stage delay buffers having similar characteristics of each of said N secondary delay buffers;
   a first selection circuit for selecting one of said first through said M-th primary delay output signals as a selected primary delay output signal;
   a second selection circuit, connected to inputs of said N first-stage delay buffers in parallel, for selecting one of said N first-stage delay buffers as a selected first-stage delay buffer of a of a second delay line to supply the selected primary delay output signal to said selected first-stage delay buffer, said second delay line comprising said selected first-stage delay buffer and (N-1) successive secondary delay buffers following said selected first-stage delay buffer; and
   a second delay locked loop for feedback controlling said second delay line.

10. A digital phase control circuit as claimed in claim 9, wherein each of said M primary delay buffers, said N secondary delay buffers, and said N first-stage delay buffers has a single-phase configuration.

11. A digital phase control circuit as claimed in claim 9, wherein each of said M primary delay buffers, said N secondary delay buffers, and said N first-stage delay buffers has a differential configuration.

12. A digital phase control circuit as claimed in claim 11, said first delay line producing first though M-th primary differential clock signal pairs as said first through said M-th primary delay output signals, said first selection circuit producing a selected primary differential clock pair as said selected primary delay output signal, wherein said digital phase control circuit further comprises a switching circuit for switching inversion and non-inversion of said selected primary differential clock signal pair to produce a passed primary differential clock signal pair which is supplied to said second selection circuit.

* * * * *